United States Patent
Lin et al.

(10) Patent No.: US 11,508,738 B2
(45) Date of Patent: Nov. 22, 2022

(54) SRAM SPEED AND MARGIN OPTIMIZATION VIA SPACER TUNING

(71) Applicant: Taiwan Semiconductor Manufacturing Co., Ltd., Hsinchu (TW)

(72) Inventors: Shih-Hao Lin, Hsinchu (TW);
Chih-Chuan Yang, Hsinchu (TW);
Hsin-Wen Su, Hsinchu (TW);
Kian-Long Lim, Hsinchu (TW);
Chien-Chih Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 73 days.

(21) Appl. No.: 17/036,487

(22) Filed: Sep. 29, 2020

(65) Prior Publication Data

US 2021/0272966 A1    Sep. 2, 2021

Related U.S. Application Data

(60) Provisional application No. 62/982,183, filed on Feb. 27, 2020.

(51) Int. Cl.
*H01L 27/11* (2006.01)
*H01L 27/092* (2006.01)
(Continued)

(52) U.S. Cl.
CPC ........ *H01L 27/1104* (2013.01); *G11C 11/412* (2013.01); *H01L 21/28123* (2013.01); *H01L 21/823807* (2013.01); *H01L 21/823814* (2013.01); *H01L 21/823821* (2013.01); *H01L 21/823864* (2013.01); *H01L 27/0922* (2013.01); *H01L 27/0924* (2013.01); *H01L 29/0847* (2013.01); *H01L 29/1037* (2013.01);
(Continued)

(58) Field of Classification Search
CPC ............. H01L 27/1104; H01L 27/0922; H01L 21/823807; H01L 21/823814; H01L 21/823864; H01L 21/764; H01L 29/0847; H01L 29/1037; H01L 29/4991; H01L 29/66545; H01L 29/6656; G11C 11/412
USPC ......................................................... 257/369
See application file for complete search history.

(56) References Cited

U.S. PATENT DOCUMENTS 8,605,523 B2   12/2013   Tao et al.
8,630,132 B2   1/2014    Cheng et al.
(Continued)

*Primary Examiner* — Dao H Nguyen
(74) *Attorney, Agent, or Firm* — Haynes and Boone, LLP

(57) ABSTRACT

An N-type metal oxide semiconductor (NMOS) transistor includes a first gate and a first spacer structure disposed on a first sidewall of the first gate in a first direction. The first spacer structure has a first thickness in the first direction and measured from an outermost point of an outer surface of the first spacer structure to the first sidewall. A P-type metal oxide semiconductor (PMOS) transistor includes a second gate and a second spacer structure disposed on a second sidewall of the second gate in the first direction and measured from an outermost point of an outer surface of the second spacer structure to the second sidewall. The second spacer structure has a second thickness that is greater than the first thickness. The NMOS transistor is a pass-gate of a static random access memory (SRAM) cell, and the PMOS transistor is a pull-up of the SRAM cell.

20 Claims, 19 Drawing Sheets

(51) Int. Cl.
  *H01L 29/08*       (2006.01)
  *H01L 29/10*       (2006.01)
  *H01L 29/49*       (2006.01)
  *H01L 21/8238*     (2006.01)
  *H01L 29/66*       (2006.01)
  *H01L 21/28*       (2006.01)
  *G11C 11/412*      (2006.01)

(52) U.S. Cl.
  CPC ...... *H01L 29/4991* (2013.01); *H01L 29/6656* (2013.01); *H01L 29/66545* (2013.01)

(56) References Cited

U.S. PATENT DOCUMENTS

| | | |
|---|---|---|
| 8,760,948 B2 | 6/2014 | Tao et al. |
| 8,796,666 B1 | 8/2014 | Huang et al. |
| 8,822,243 B2 | 9/2014 | Yan et al. |
| 8,987,142 B2 | 3/2015 | Lee et al. |
| 9,053,279 B2 | 6/2015 | Chang et al. |
| 9,093,530 B2 | 7/2015 | Huang et al. |
| 9,099,530 B2 | 8/2015 | Lin et al. |
| 9,153,478 B2 | 10/2015 | Liu et al. |
| 9,501,601 B2 | 11/2016 | Chang et al. |
| 9,548,303 B2 | 1/2017 | Lee et al. |
| 9,876,114 B2 | 1/2018 | Huang |
| 2007/0001233 A1* | 1/2007 | Schwan ............ H01L 29/7848 257/369 |
| 2007/0235817 A1* | 10/2007 | Wang .................. H01L 27/1104 257/E27.099 |
| 2012/0202326 A1* | 8/2012 | Kronholz ........ H01L 21/823814 438/231 |
| 2014/0032871 A1 | 1/2014 | Hsu et al. |
| 2014/0153321 A1 | 6/2014 | Liaw |
| 2014/0153345 A1 | 6/2014 | Kim et al. |
| 2014/0177352 A1 | 6/2014 | Lum |
| 2014/0233330 A1 | 8/2014 | Ko et al. |
| 2014/0241077 A1 | 8/2014 | Katoch et al. |
| 2014/0269114 A1 | 9/2014 | Yang et al. |
| 2014/0273367 A1* | 9/2014 | Javorka ........... H01L 21/823842 438/217 |
| 2016/0190318 A1* | 6/2016 | Chen ............... H01L 21/823418 257/190 |

\* cited by examiner

SRAM SPEED AND MARGIN OPTIMIZATION VIA SPACER TUNING

PRIORITY DATA

The present application is a utility patent application of U.S. provisional patent application No. 62/982,183, filed on Feb. 27, 2020, entitled "SRAM Speed and Margin Optimization Via Spacer Tuning", the disclosure of which is hereby incorporated by reference in its entirety.

BACKGROUND

In deep sub-micron integrated circuit technology, an embedded static random access memory (SRAM) device has become a popular storage unit of high speed communication, image processing and system-on-chip (SOC) products. The amount of embedded SRAM in microprocessors and SOCs increases to meet the performance requirement in each new technology generation. As silicon technology continues to scale from one generation to the next, parasitic effects may be impacting SRAM device performance more and more. For example, device parasitics and gap filling issues may become a greater factor as semiconductor feature sizes continue to shrink, which may lead to sub-par SRAM performance or even device failures.

Therefore, although existing SRAM devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
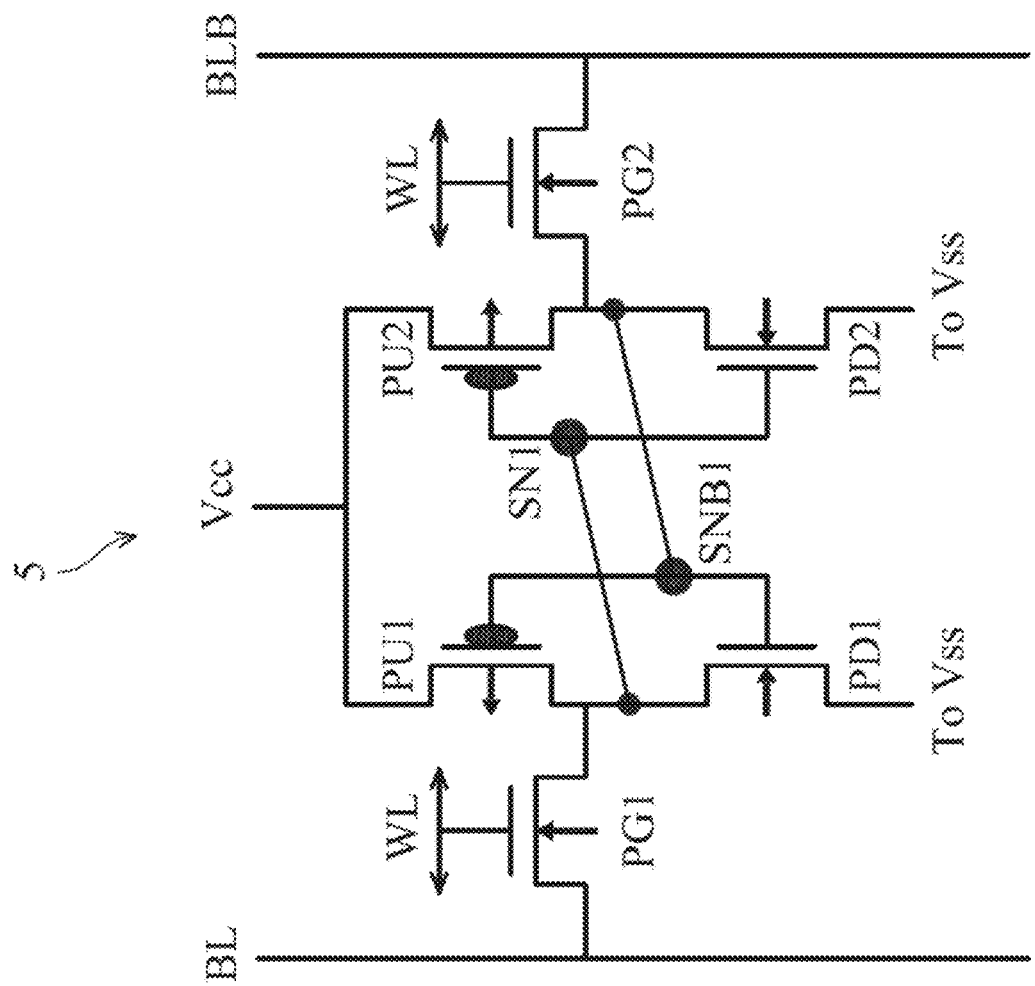
FIG. 1 illustrates a circuit schematic for a 1-bit SRAM cell according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, a static random access memory (SRAM) device. An SRAM device is a type of semiconductor memory that uses bi-stable latching circuitry (e.g., flip-flop) to store binary bits of information. A typical SRAM cell may include pull-up (PU) transistors, pull-down (PD) transistors, and pass-gate (PG) transistors. As semiconductor technology nodes continue to advance to smaller generations (e.g., smaller than the 10-nanometer node), the SRAM write and read margins may become more important. An alpha ratio of the SRAM—defined as PU's $Id_{sat}$ (saturation current) divided by PG's $Id_{sat}$—may be tuned to achieve the desired write and/or read margin of the SRAM. Since $Id_{sat}$ is an inverse function of a threshold voltage (Vt), the threshold voltage may be tuned to arrive at the desired $Id_{sat}$.

Conventional threshold voltage tuning techniques usually rely solely on configuring the material composition and/or the thicknesses of work function metal layers of a gate electrode. However, as device sizes continue to get scaled down, this approach encounters difficulties. For example, the gate electrode formation process may involve a gate replacement process where a dummy gate electrode is removed to form an opening, and a metal-containing gate electrode (which includes the work function metal layers for tuning threshold voltage) fills in the opening to replace the removed dummy gate electrode. As device sizes continue to shrink, the opening (formed due to the removal of the dummy gate electrode) becomes smaller or narrower as well, which makes it harder for it to be filled by the metal gate electrode (that contains the work function metal layers). In some cases, air gaps may be trapped in the metal gate electrode. In addition, the N-type metal gates may share direct boundaries with P-type metal gates. As device sizes continue to shrink, the metal diffusion (e.g., caused by an aluminum-containing work function metal layer) from one type of metal gate into the opposite type of metal gate (that is located adjacent thereto) is also more likely to occur, which is undesirable. For these reasons, the scaling down of semiconductor devices makes it more and more difficult to tune threshold voltage using the work function metal layers of metal gate electrodes alone.

To overcome the problems discussed above, the present disclosure tunes the threshold voltage by configuring the gate spacers of the transistors of an SRAM device. For example, the gate spacers for the N-type transistors may be configured to be thinner (in a lateral dimension) than the gate spacers for the P-type transistors in some embodiments. This allows the alpha ratio to be adjusted to a desired value in order to optimize the write margin and the read margin. Furthermore, air spacers may also be implemented as a part of the gate spacers in some embodiments. The air spacers help lower the overall dielectric constant of the gate spacers, which in turn will reduce the parasitic capacitance of the SRAM device and increase its speed.

Figure 16:
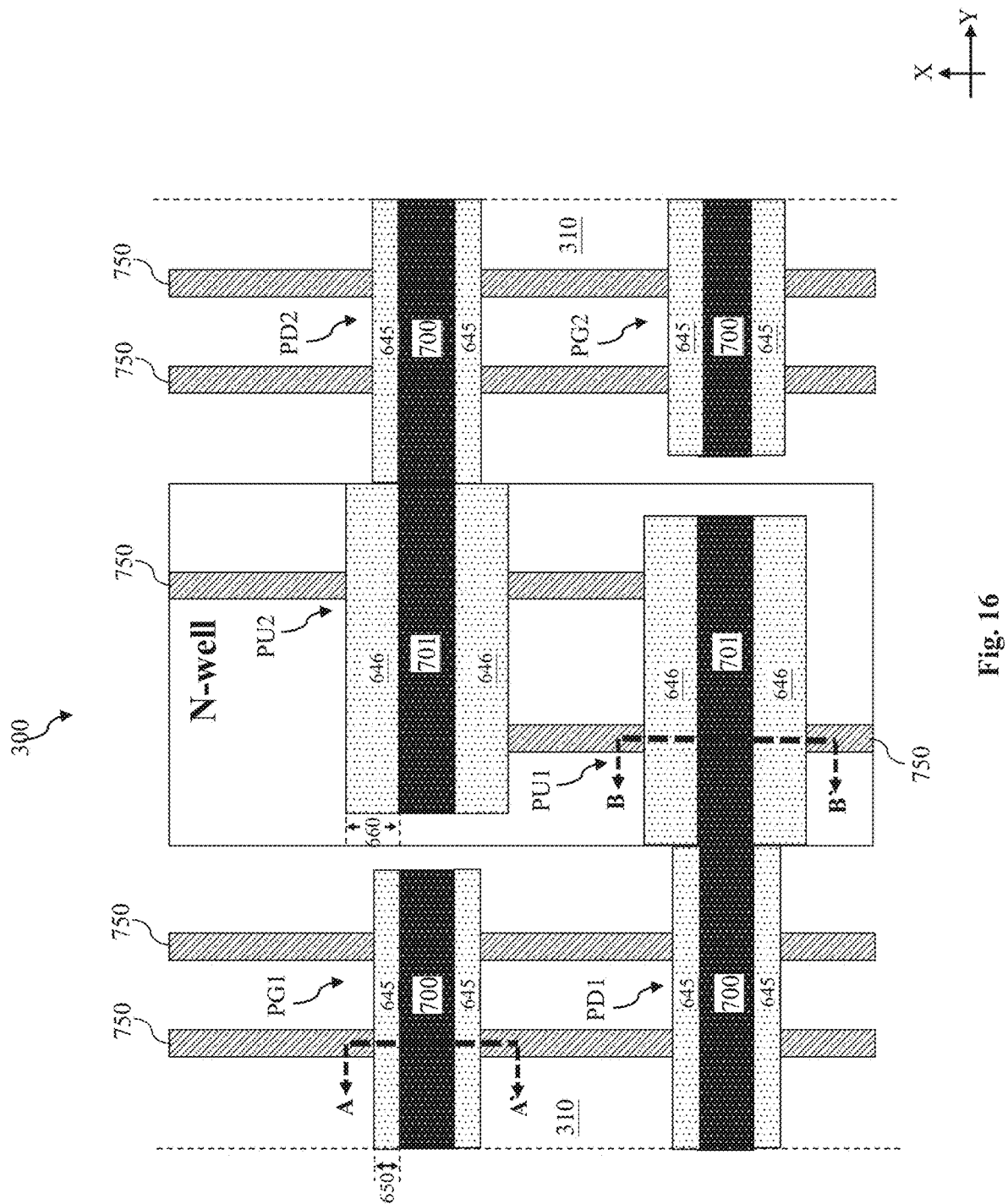
FIGS. 16-17 are top views of a semiconductor device at a stage of fabrication according to embodiments of the present disclosure.
Figure 17:
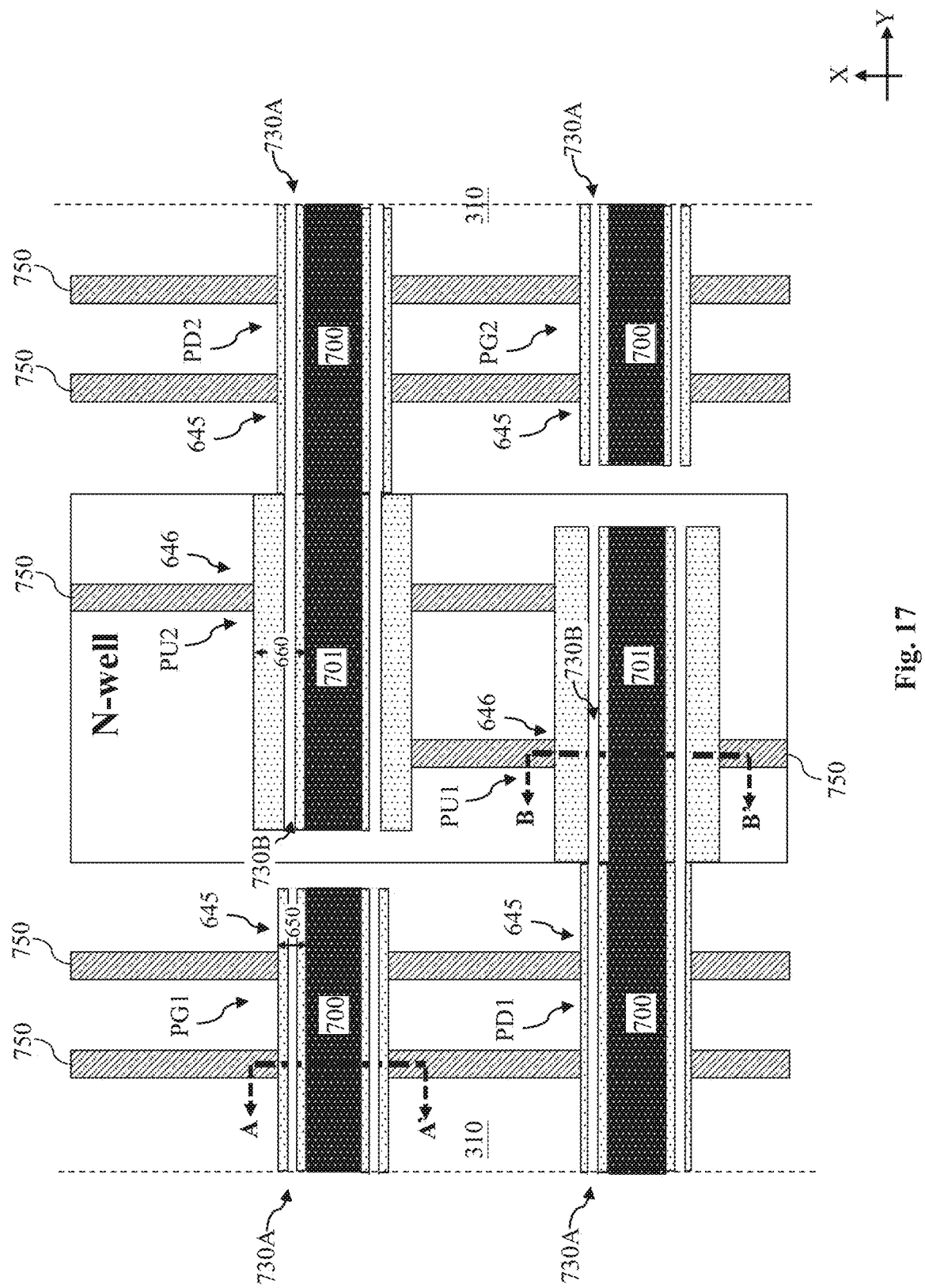
Figure 18:
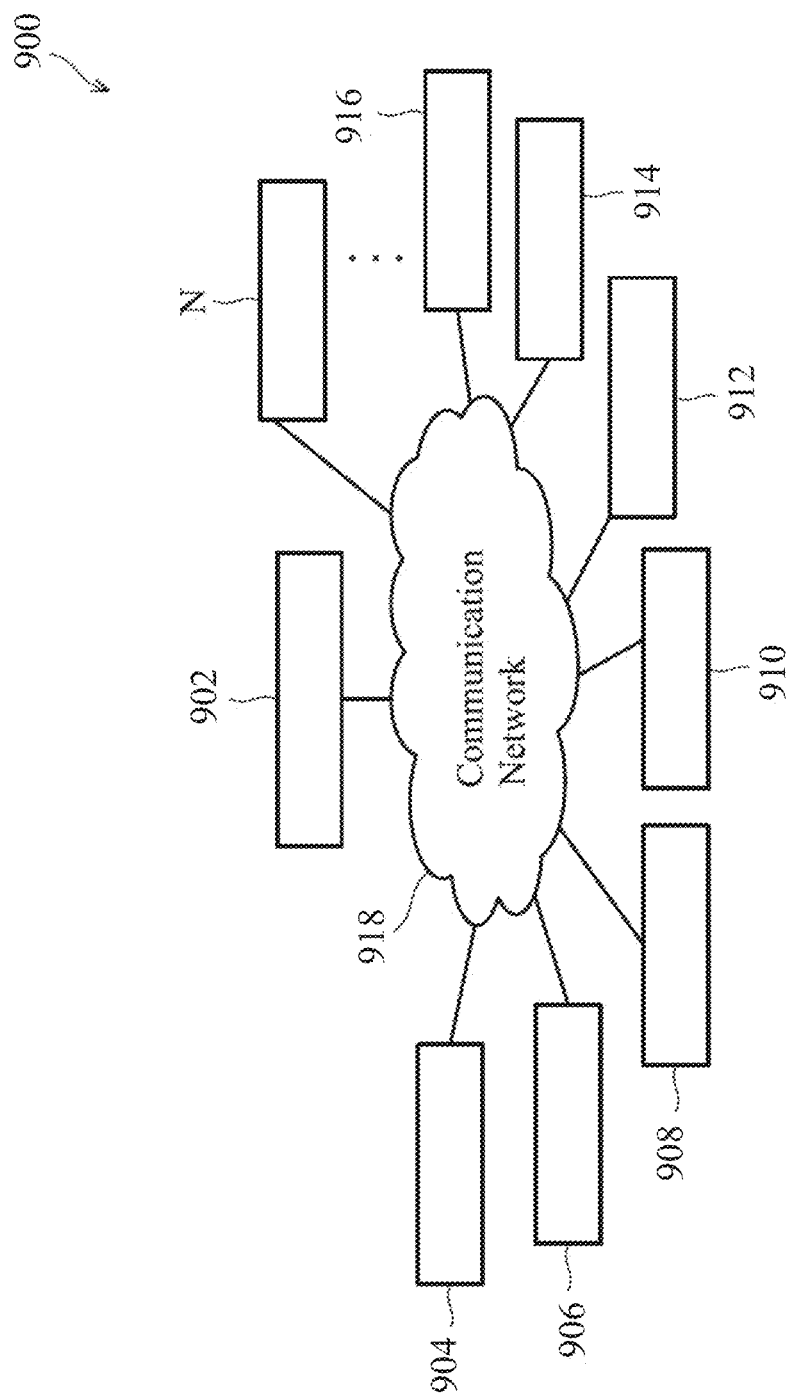
FIG. 18 illustrates an integrated circuit fabrication system according to an embodiment of the present disclosure.
Figure 19:
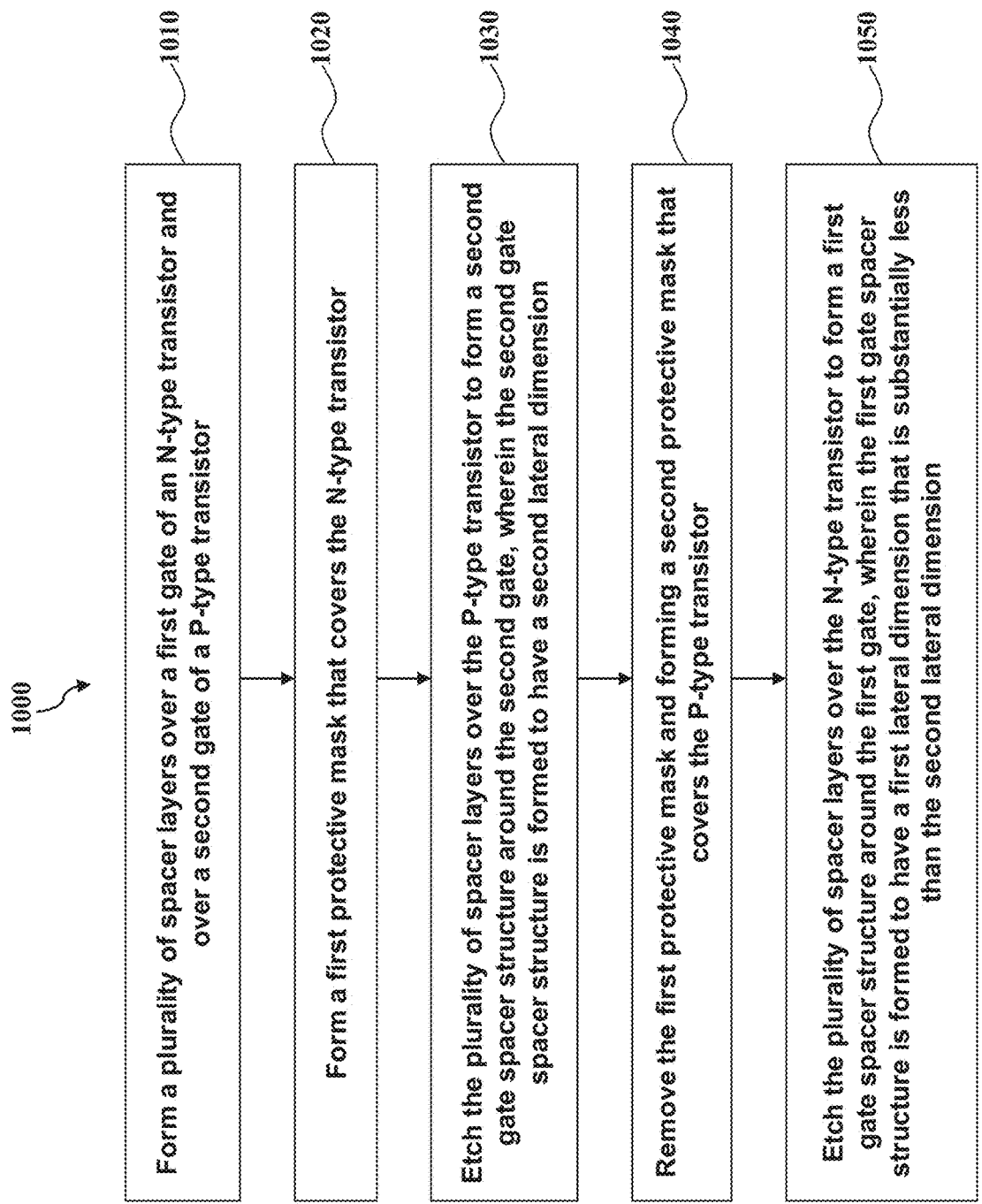
FIG. 19 is a flowchart illustrating a method of fabricating a semiconductor device according to various aspects of the present disclosure.

The various aspects of the present disclosure are now discussed below in more detail with reference to FIGS. 1-19. In that regard, an example circuit schematic and device implementation of an SRAM device are provided in FIGS. 1-2. A graph illustrating a relationship between an alpha ratio and a minimum operating voltage of an SRAM is illustrated in FIG. 3. An example fabrication process flow of fabricating the SRAM device of the present disclosure is provided in FIGS. 4-15. Example top views of the SRAM device is illustrated in FIGS. 16-17. An example semiconductor fabrication system is illustrated in FIG. 18. A flowchart corresponding to a method of the present disclosure is illustrated in FIG. 19.

Referring now to FIG. 1, FIG. 1 illustrates an example circuit schematic for a single-port SRAM cell (e.g., 1-bit SRAM cell) 5. The single-port SRAM cell 5 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. According to the various aspects of the present disclosure, the PG1, PG2, PD1, and PD2 transistors are implemented with thinner spacers than the PU1 and PU2 transistors. As discussed above, this helps the tuning of the threshold voltage to achieve a desired write margin and read margin. Since the SRAM cell 5 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node N1 and the complementary first storage node SNB1 are complementary nodes that are often at opposite logic levels (logic high or logic low). Gates of pass-gate transistors PG1 and PG2 are coupled to a word line WL.

SRAM devices such as the SRAM cell 5 may be implemented using "planar" transistor devices and/or with FinFET devices. In that regard, a FinFET device is a fin-like field-effect transistor device, which has been gaining popularity recently in the semiconductor industry. FinFET devices offer several advantages over traditional Metal-Oxide Semiconductor Field Effect Transistor (MOSFET) devices (e.g., "planar" transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

The FinFET device may be a complementary metal-oxide-semiconductor (CMOS) device including a P-type metal-oxide-semiconductor (PMOS) FinFET device and an N-type metal-oxide-semiconductor (NMOS) FinFET device. It is understood that some aspects of the following disclosure may be discussed using FinFET devices as examples, but it is understood that the application is not limited to FinFET devices, except as specifically claimed.

Figure 2:
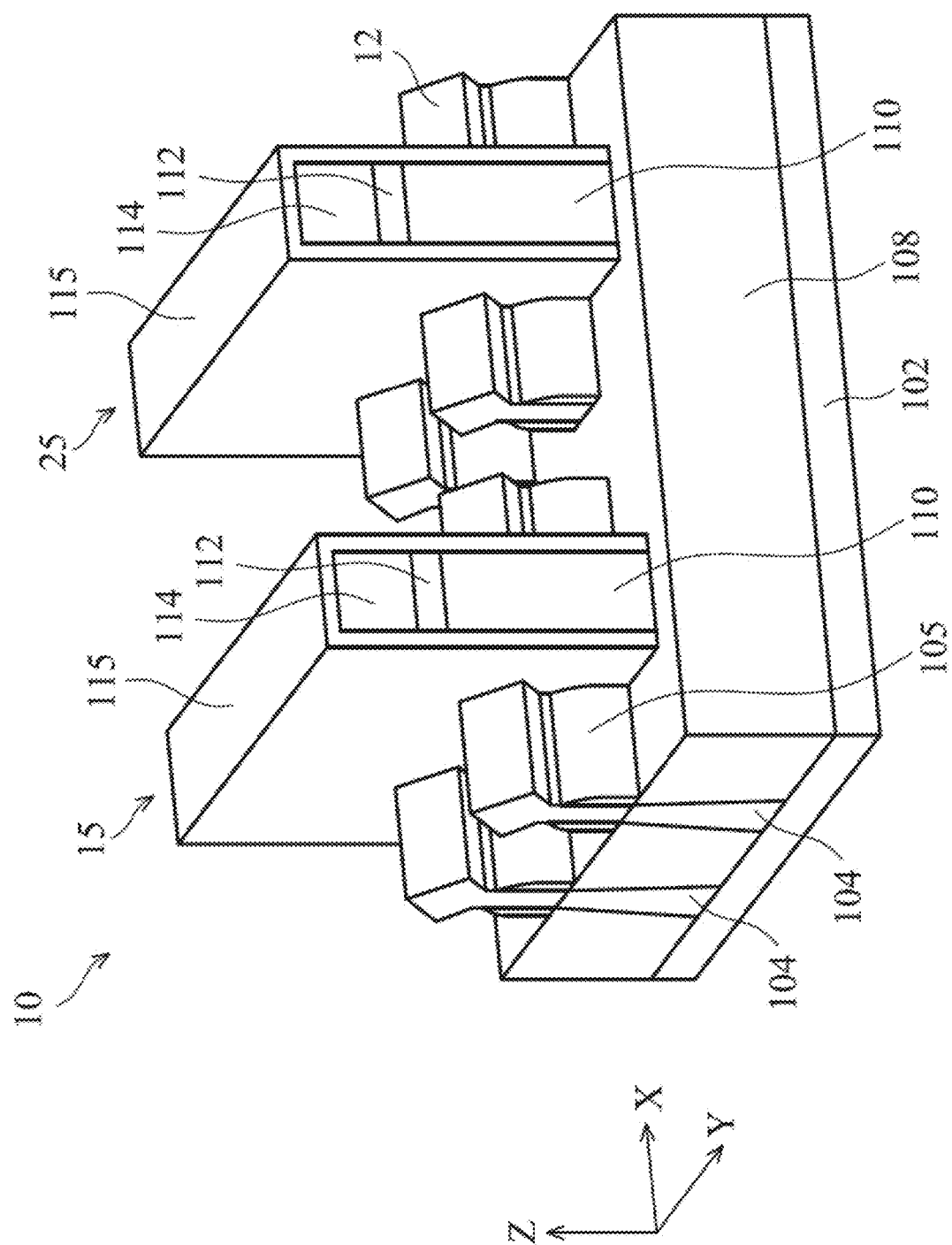
FIG. 2 illustrates a perspective three-dimensional view of a FinFET device according to an embodiment of the present disclosure.
Figure 3:
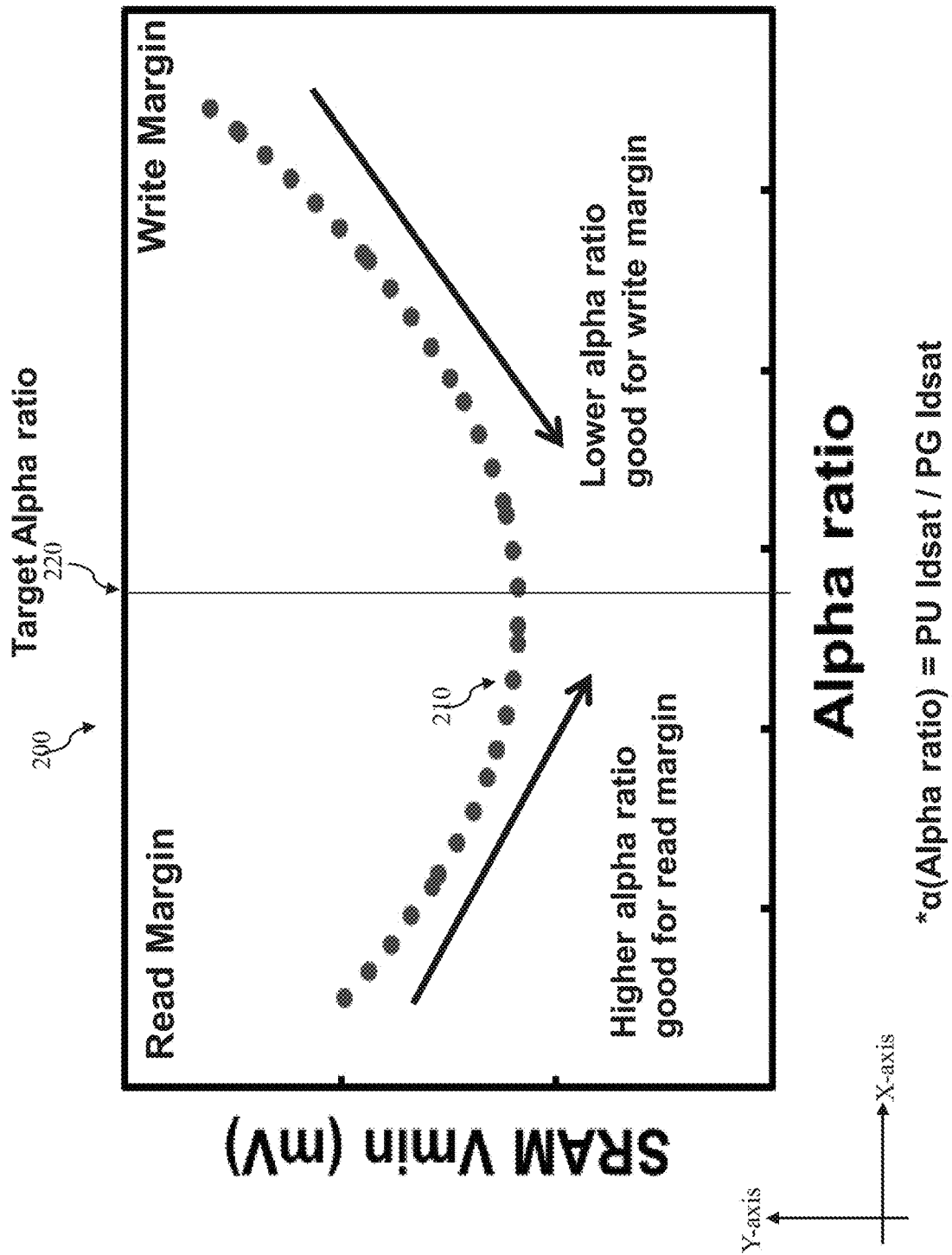
FIG. 3 is a graph illustrating a relationship between an alpha ratio and a SRAM minimum operating voltage.

Referring to FIG. 2, a perspective view of an example FinFET device 10 is illustrated. The FinFET device structure 10 includes an N-type FinFET device structure (NMOS) 15 and a P-type FinFET device structure (PMOS) 25. The FinFET device structure 10 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 may include an epitaxial layer overlying a bulk semiconductor.

The FinFET device structure 10 also includes one or more fin structures 104 (e.g., Si fins) that extend from the substrate 102 in the Z-direction and surrounded by spacers 105 in the Y-direction. The fin structure 104 is elongated in the X-direction and may optionally include germanium (Ge). The fin structure 104 may be formed by using suitable processes such as photolithography and etching processes. In some embodiments, the fin structure 104 is etched from the substrate 102 using dry etch or plasma processes. In some other embodiments, the fin structure 104 can be formed by a multiple patterning lithography process, such as a double-patterning lithography (DPL) process. DPL is a method of constructing a pattern on a substrate by dividing the pattern into two interleaved patterns. DPL allows enhanced feature (e.g., fin) density. The fin structure 104 also includes an epi-grown material 12, which may (along with portions of the fin structure 104) serve as the source/drain of the FinFET device structure 10.

An isolation structure 108, such as a shallow trench isolation (STI) structure, is formed to surround the fin structure 104. In some embodiments, a lower portion of the fin structure 104 is surrounded by the isolation structure 108, and an upper portion of the fin structure 104 protrudes from the isolation structure 108, as shown in FIG. 2. In other words, a portion of the fin structure 104 is embedded in the isolation structure 108. The isolation structure 108 prevents electrical interference or crosstalk.

The FinFET device structure 10 further includes a gate stack structure including a gate electrode 110 and a gate dielectric layer (not shown) below the gate electrode 110. The gate electrode 110 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 110 may be formed in a gate last process (or gate replacement process). Hard mask layers 112 and 114 may be used to define the gate electrode 110.

A dielectric layer 115 may also be formed on the sidewalls of the gate electrode 110 and over the hard mask layers 112 and 114. In at least one embodiment, the dielectric layer 115 is directly in contact with the gate electrode 110. Portions of the dielectric layer 115 may be gate spacers disposed on sidewalls of the gate electrode 110. According to various aspects of the present disclosure, the gate spacers disposed on the gate electrode 110 of the NMOS 15 may be substantially thinner than the gate spacers disposed on the gate electrode 110 of the PMOS 25, which will be shown more clearly with reference to FIGS. 4-17 and as discussed below.

The gate dielectric layer (not shown in FIG. 2 herein) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

In some embodiments, the gate stack structure includes additional layers, such as interfacial layers, capping layers, diffusion/barrier layers, or other applicable layers. In some embodiments, the gate stack structure is formed over a central portion of the fin structure 104. In some other embodiments, multiple gate stack structures are formed over the fin structure 104. In some other embodiments, the gate stack structure includes a dummy gate stack and is replaced later by a metal gate (MG) after high thermal budget processes are performed.

The gate stack structure is formed by a deposition process, a photolithography process and an etching process. The deposition process includes chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

FIG. 3 illustrates a graph 200 that visually illustrates a relationship between a SRAM Vmin (minimum voltage) versus an alpha ratio. As discussed above, the alpha ratio represents the X-axis of the graph 200 and is defined as PU $Id_{sat}$ (saturation current of a PU transistor of the SRAM) divided by PG $Id_{sat}$ (saturation current of a PG transistor of the SRAM). The SRAM Vmin represents the Y-axis of the graph and refers to the minimum operating voltage of the SRAM. The graph 200 includes a curve 210 that represents the value of the SRAM Vmin corresponding to different alpha ratios. The alpha ratio and the SRAM Vmin are related to the read margin and the write margin of the SRAM. Based on the shape of the curve 210, it can be seen that a read margin of the SRAM improves as the alpha ratio increases, but a write margin of the SRAM improves as the alpha ratio decreases.

As will be discussed in more detail below, the embodiments of the present disclosure achieve a target alpha ratio 220 that leads to a read margin and a write margin in a manner that is optimal to the performance of the SRAM device. For example, the inventors of the present disclosure have recognized that for SRAM devices, the write margin may be of greater concern than the read margin. For example, a low read margin may still be compensated by other devices and/or techniques after a read operation of the SRAM, but a low write margin is more difficult to compensate and may lead to difficulties or errors during a write operation of the SRAM. Accordingly, the target alpha ratio 220 should have a value that offers more room for the write margin (e.g., relaxes the write margin), even if the read margin is sacrificed somewhat. This means that the alpha ratio should be lowered, or "shifted to the left" along the X-axis, compared to conventional devices. And since alpha ratio is correlated to the PU $Id_{sat}$ and inversely correlated to the PG $Id_{sat}$, lowering the alpha ratio may be accomplished by decreasing the PU $Id_{sat}$, increasing the PG $Id_{sat}$, or both. Also, as discussed above, the PU $Id_{sat}$ and the PG $Id_{sat}$ are inversely related to the threshold voltages of the PMOS and NMOS transistors, respectively. Therefore, the present disclosure will decrease the PU $Id_{sat}$ and/or increase the PG $Id_{sat}$ by increasing threshold voltage of the PMOS transistors (e.g., PU1 and PU2) of the SRAM and/or decreasing the threshold voltage of the NMOS transistors (e.g., PG1 and PG2) of the SRAM. As will be discussed below in more detail with reference to FIGS. 4-17, the respective increase and decrease of the threshold voltages of the PMOS and NMOS transistors may be achieved by thinning the spacer thickness of the NMOS transistors relative to the PMOS transistors.

FIGS. 4-15 are diagrammatic cross-sectional side views of a semiconductor conductor device 300 at various stages of fabrication according to embodiments of the present disclosure. For example, the cross-sectional side views of an NFET (or NMOS) and a PFET (or PMOS) are illustrated. It is understood that the cross-sectional cuts in FIGS. 4-15 are each taken along an X-Z plane defined by the X-direction (horizontal direction) and the Z-direction (vertical direction) of FIG. 2. However, the NMOS and the PMOS may or may not be located on the same plane. In other words, the cross-sectional cut of the NMOS may be taken at a first X-Z plane, and the cross-sectional cut of the PMOS may be taken at a second X-Z plane that is spaced apart from the first X-Z plane in the Y-direction of FIG. 2. For reasons of simplicity, however, the cross-sectional views of the NMOS and PMOS are illustrated simultaneously in FIGS. 4-15.

Figure 4:
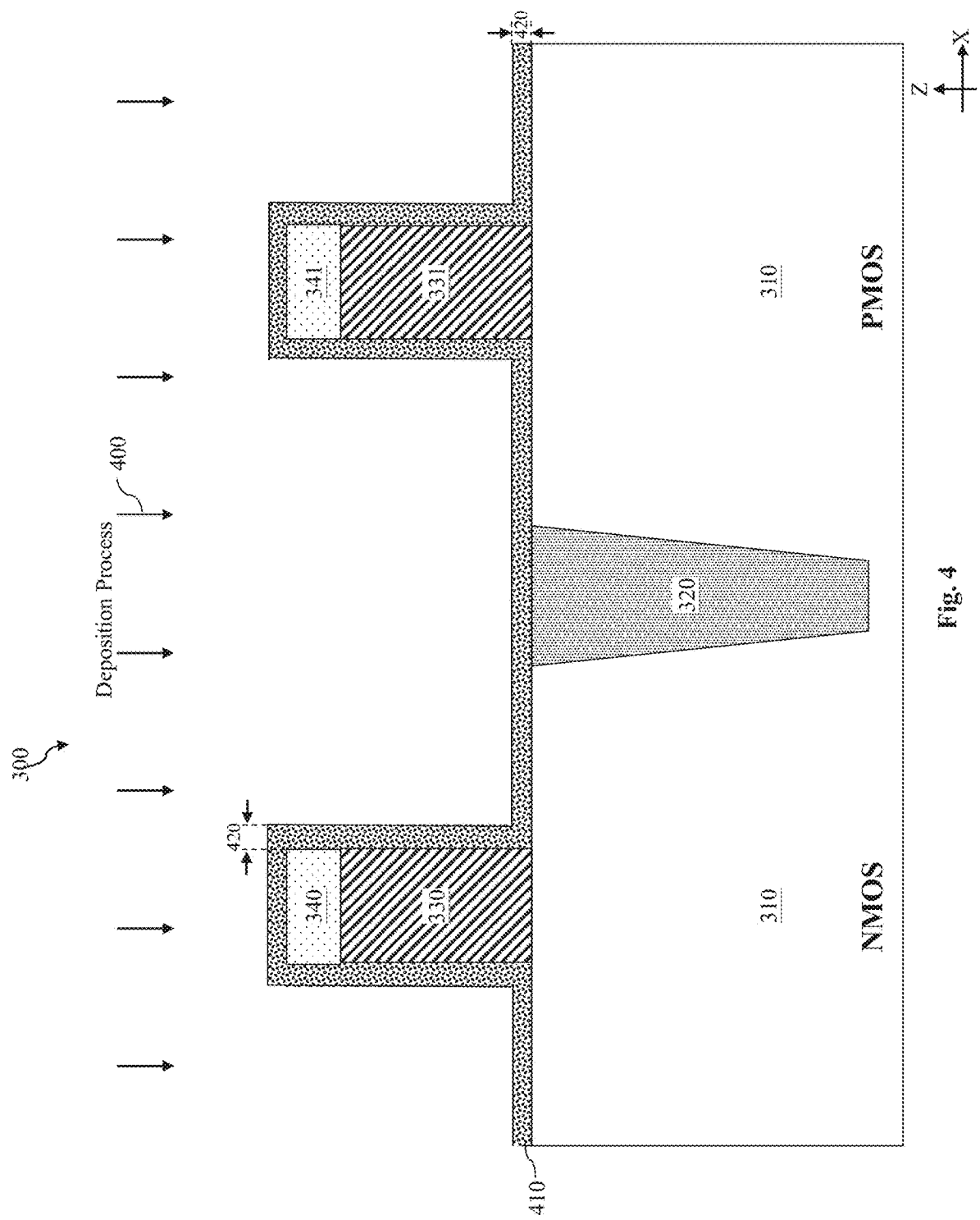
FIGS. 4-15 are cross-sectional views of a semiconductor device at various stages of fabrication according to embodiments of the present disclosure.

Referring now to FIG. 4, the semiconductor device 300 includes an NMOS (or NFET) and a PMOS (or PFET). In some embodiments, the semiconductor device 300 may be the SRAM cell 5 of FIG. 1. For example, the NMOS is a part of the PG or PD transistors of the SRAM, for example PG1, PG2, PD1, or PD2 of the SRAM cell 5, and the PMOS is a part of the PU transistors of the SRAM, for example PU1 or PU2 of the SRAM cell 5. In other embodiments, the semiconductor device 300 may be another type of IC device.

The semiconductor device 300 includes a substrate 310. The substrate 310 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 310 may be a single-layer material having a uniform composition. Alternatively, the substrate 310 may include multiple material layers having similar or different compositions suitable for IC device manufacturing. In one example, the substrate 310 may be a silicon-on-insulator (SOI) substrate having a semiconductor silicon layer formed on a silicon oxide layer. In another example, the substrate 310 may include a conductive layer, a semiconductor layer, a dielectric layer, other layers, or combinations thereof. Various doped regions, such as source/drain regions, may be formed in or on the substrate 310. The doped regions may be doped with n-type dopants, such as phosphorus or arsenic, and/or p-type dopants, such as boron, depending on design requirements. The doped regions may be formed directly on the substrate 310, in a p-well structure, in an n-well structure, in a dual-well structure, or using a raised structure. In some embodiments, the PMOS may be formed over an n-well. Doped regions may be formed by implantation of dopant atoms, in-situ doped epitaxial growth, and/or other suitable techniques.

A dielectric isolation structure 320 may be disposed in the substrate 310. For example, the isolation structure 320 may include shallow trench isolation (STI) features. In one embodiment, the isolation structures 320 are formed by etching trenches in the substrate 102. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 320. Alternatively, the isolation structures 320 may include a multi-layer structure, for example, having one or more thermal oxide liner layers.

A plurality of dummy gate structures is formed over the substrate 310. For example, a dummy gate structure 330 is formed over the substrate 310 for the NMOS, and a dummy gate structure 331 is formed over the substrate 310 for the PMOS. In some embodiments, the dummy gate structures 330 and 331 each contain a dummy gate dielectric and a dummy gate electrode that is formed over the dummy gate dielectric. For example, the dummy gate dielectric may include silicon oxide, and the dummy gate electrode may include polysilicon. Though not depicted herein, the dummy gate structures 330-331 may include additional material layers, such as an interfacial layer, a capping layer, other suitable layers, or combinations thereof.

Hard masks (HM) are disposed over the dummy gate structures 330-331. For example, a hard mask 340 is disposed over the dummy gate structure 330, and a hard mask 341 is disposed over the dummy gate structure 331. The hard masks 340-341 may define the shape or profile of the dummy gate structures 330-331, respectively. For example, a dummy gate layer (e.g., a polysilicon layer and a silicon oxide layer) may be formed over the substrate 310. A hard mask layer may be formed over the dummy gate layer. A photolithography process may be performed to pattern the hard mask layer into the hard masks 340-341. The dummy gate layer may then be patterned by the hard masks. Portions of the dummy gate layer underneath the hard masks 340-341 are protected from being etched, while the exposed portions of the dummy gate layer are etched away. The remaining portions of the dummy gate layer form the dummy gate structures 330-331.

A deposition process 400 is performed to form a spacer layer 410 over the gate structures 330-331 and over the hard masks 340-341. In some embodiments, the deposition process 400 may include CVD, PVD, ALD, or combinations thereof. The spacer layer 410 may have a dielectric material composition. In some embodiments, the spacer layer 410 may contain silicon oxy-carbon nitride (SiOCN). The spacer layer 410 has a thickness 420. In some embodiments, the thickness 420 is formed to be in a range between about 10 angstroms and about 20 angstroms. Note that since the spacer layer 410 is deposited over both the NMOS and the PMOS, the thickness 420 may be substantially the same for both the NMOS side of the spacer layer 410 and the PMOS side of the spacer layer 410.

Figure 5:
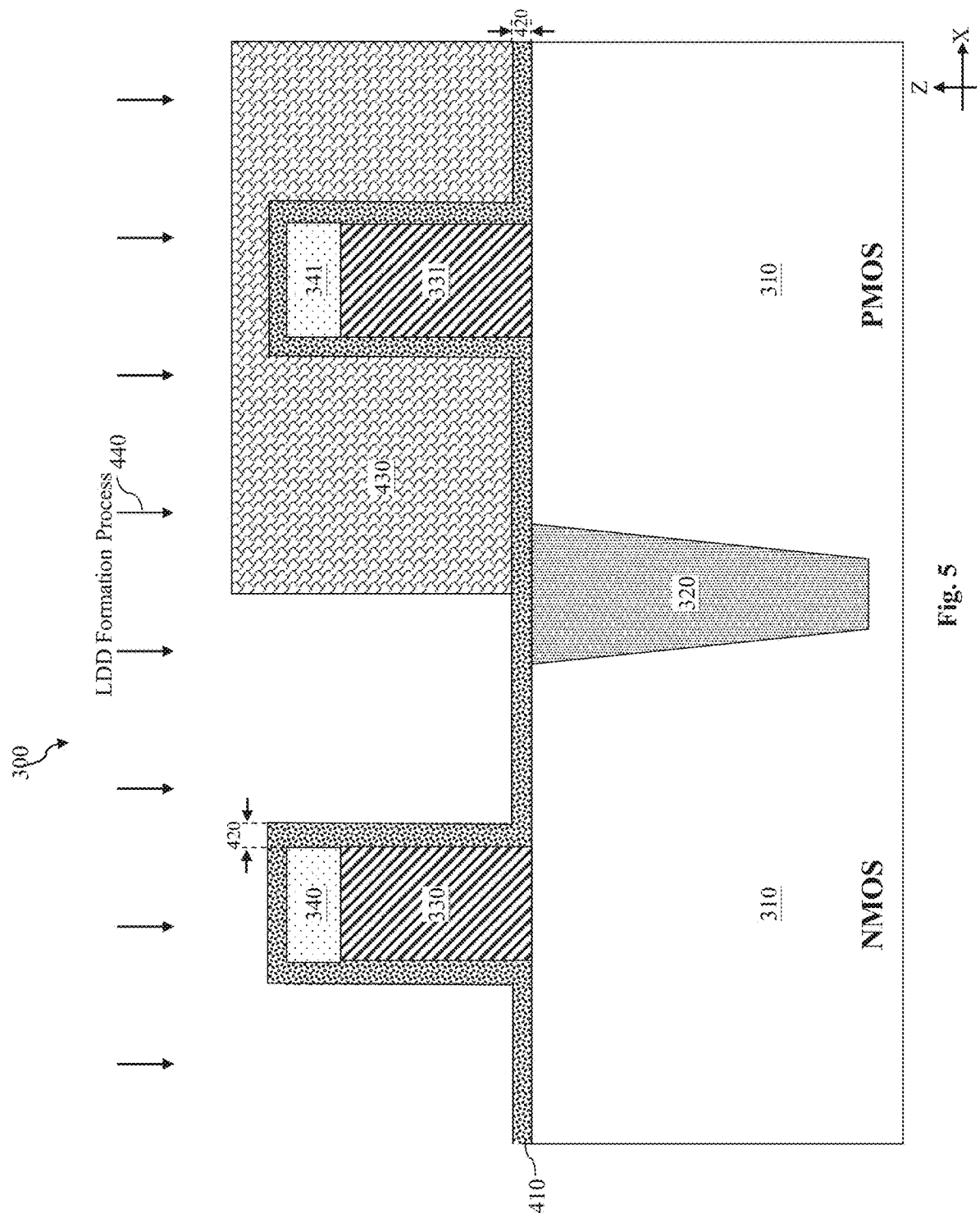

Referring to FIG. 5, a patterned photoresist layer 430 is formed to cover up the PMOS side of the semiconductor device 300, while leaving the NMOS side of the semiconductor device 300 exposed. For example, the patterned photoresist layer 430 is formed over the dummy gate structure 331, over the hard mask 341, and over the portions of the spacer layer 410 on the PMOS side. The patterned photoresist layer 430 may be formed by a lithography process that may include one or more of spin coating, exposing, baking, developing, and etching processes (not necessarily performed in this order). With the patterned photoresist layer 430 serving as a mask, a lightly-doped source/drain (LDD) formation process 440 is performed to form the lightly doped source/drain regions (not specifically illustrated herein for reasons of simplicity) in the NMOS. In some embodiments, the LDD formation process 440 may include one or more doping (e.g., ion implantation) processes. As a result, the source/drain (S/D) regions for NMOS are partially formed.

Figure 6:
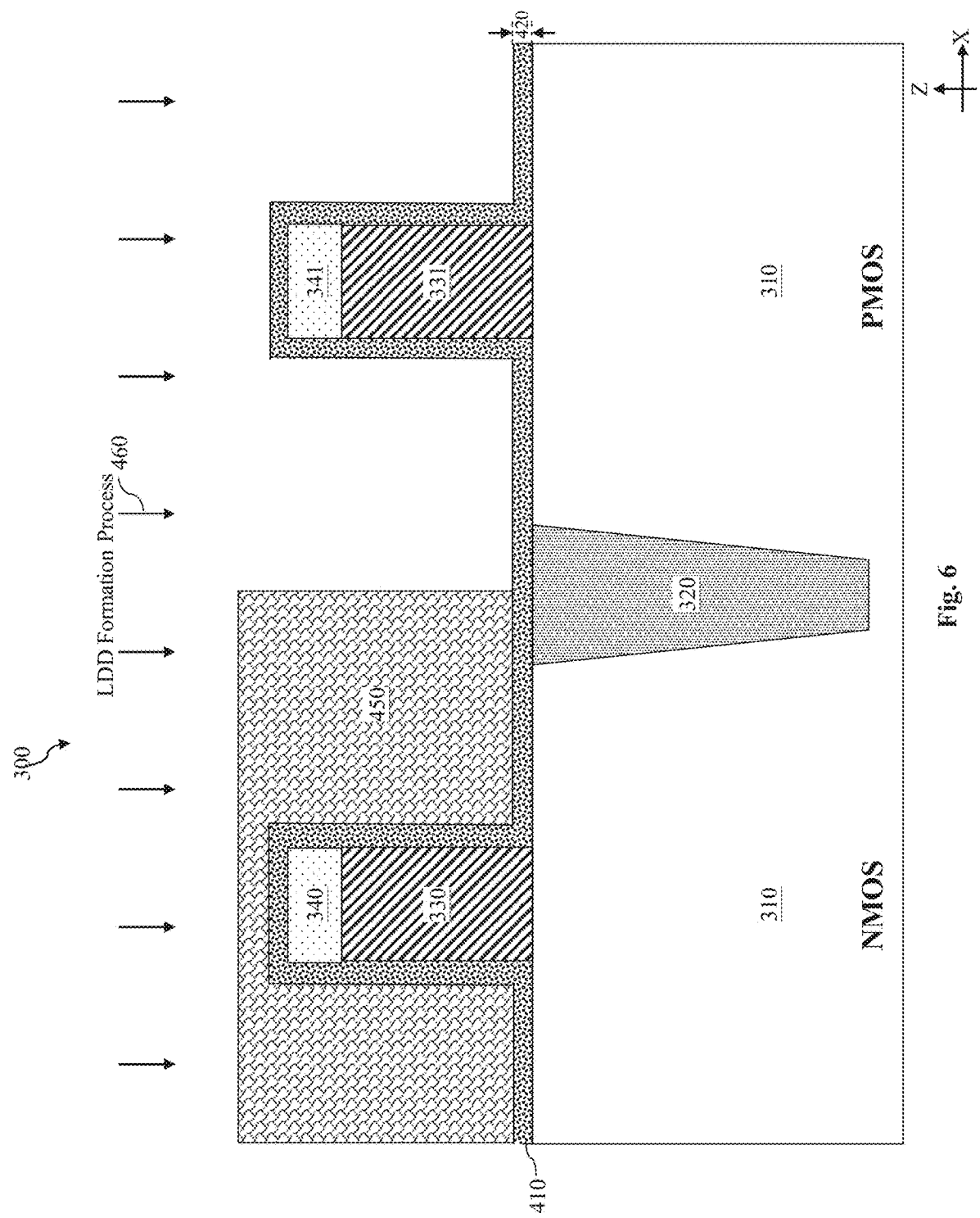

Referring to FIG. 6, the patterned photoresist layer 430 is removed, for example using a photoresist stripping or ashing process. Thereafter, another patterned photoresist layer 450 is formed to cover up the NMOS side of the semiconductor device 300, while leaving the PMOS side of the semiconductor device 300 exposed. For example, the patterned photoresist layer 450 is formed over the dummy gate structure 330, over the hard mask 340, and over the portions of the spacer layer 410 on the NMOS side. The patterned photoresist layer 450 may be formed by a lithography process that may include one or more of spin coating, exposing, baking, developing, etching, and stripping/ashing processes (not necessarily performed in this order). With the patterned photoresist layer 450 serving as a mask, a lightly-doped source/drain (LDD) formation process 460 is performed to form the lightly doped source/drain regions (not specifically illustrated herein for reasons of simplicity) in the PMOS. In some embodiments, the LDD formation process 460 may include one or more doping (e.g., ion implantation) processes. As a result, the source/drain (S/D) regions for PMOS are partially formed. It is understood that one or more annealing processes may be performed after the formation of the NMOS LDD regions, the PMOS LDD regions, or both.

Figure 7:
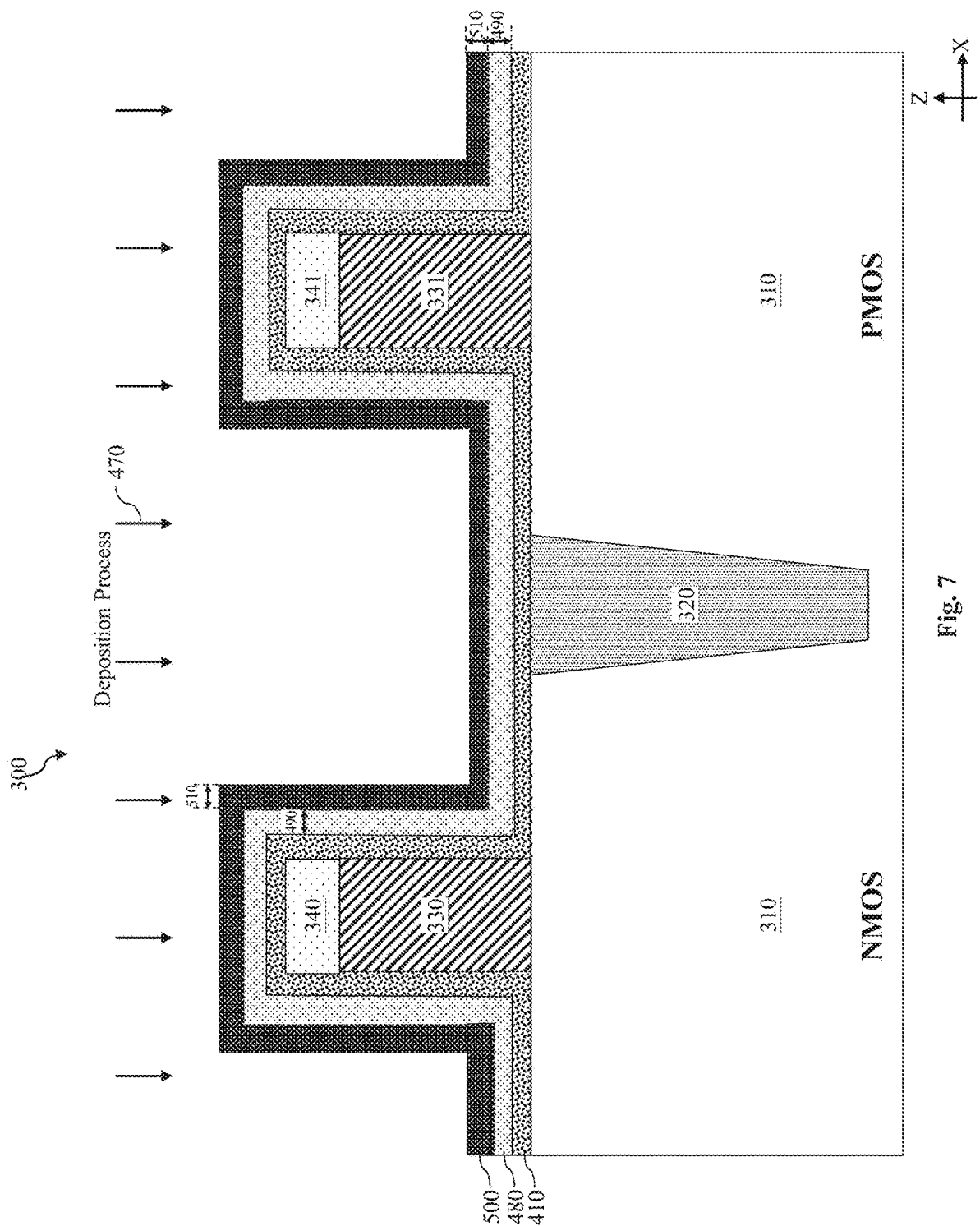

Referring now to FIG. 7, the patterned photoresist layer 450 is removed, for example using a photoresist stripping or ashing process. Thereafter, one or more deposition processes 470 are performed to form a spacer layer 480 over the spacer layer 410 and to form a spacer layer 500 over the spacer layer 480. In some embodiments, the deposition processes 470 may include CVD, PVD, ALD, or combinations thereof.

The spacer layers 480 and 500 may each have a dielectric material composition. In some embodiments, the spacer layer 480 may contain silicon oxy carbon nitride (SiOCN), and the spacer layer 500 may contain silicon nitride ($Si_3N_4$). In some embodiments, the spacer layer 480 and the spacer layer 410 may have different contents or concentrations of carbon and/or nitrogen, even when they both contain SiOCN. In other embodiments, the spacer layer 480 and the spacer layer 410 include different types of dielectric materials.

The spacer layer 480 has a thickness 490, and spacer layer 500 has a thickness 510. In some embodiments, the thickness 490 is formed to be in a range between about 10 angstroms and about 20 angstroms, and the thickness 510 is formed to be in a range between about 20 angstroms and about 30 angstroms. Note that these thickness ranges are not randomly chosen but specifically configured according to various aspects of the present disclosure. If the thickness 490 and/or 510 is too thin, it may not provide sufficient amount of margin for the spacer thickness tuning discussed in more detail below. On the other hand, if the thickness 490 and/or 510 is too thick, it may consume too much chip real estate or otherwise decrease pattern density. Note that since the spacer layer 480 is deposited over both the NMOS and the PMOS, the thickness 490 may be substantially the same for both the NMOS side of the spacer layer 480 and the PMOS side of the spacer layer 480. The same is true for the spacer layer 500 and its thickness 510.

Figure 8:
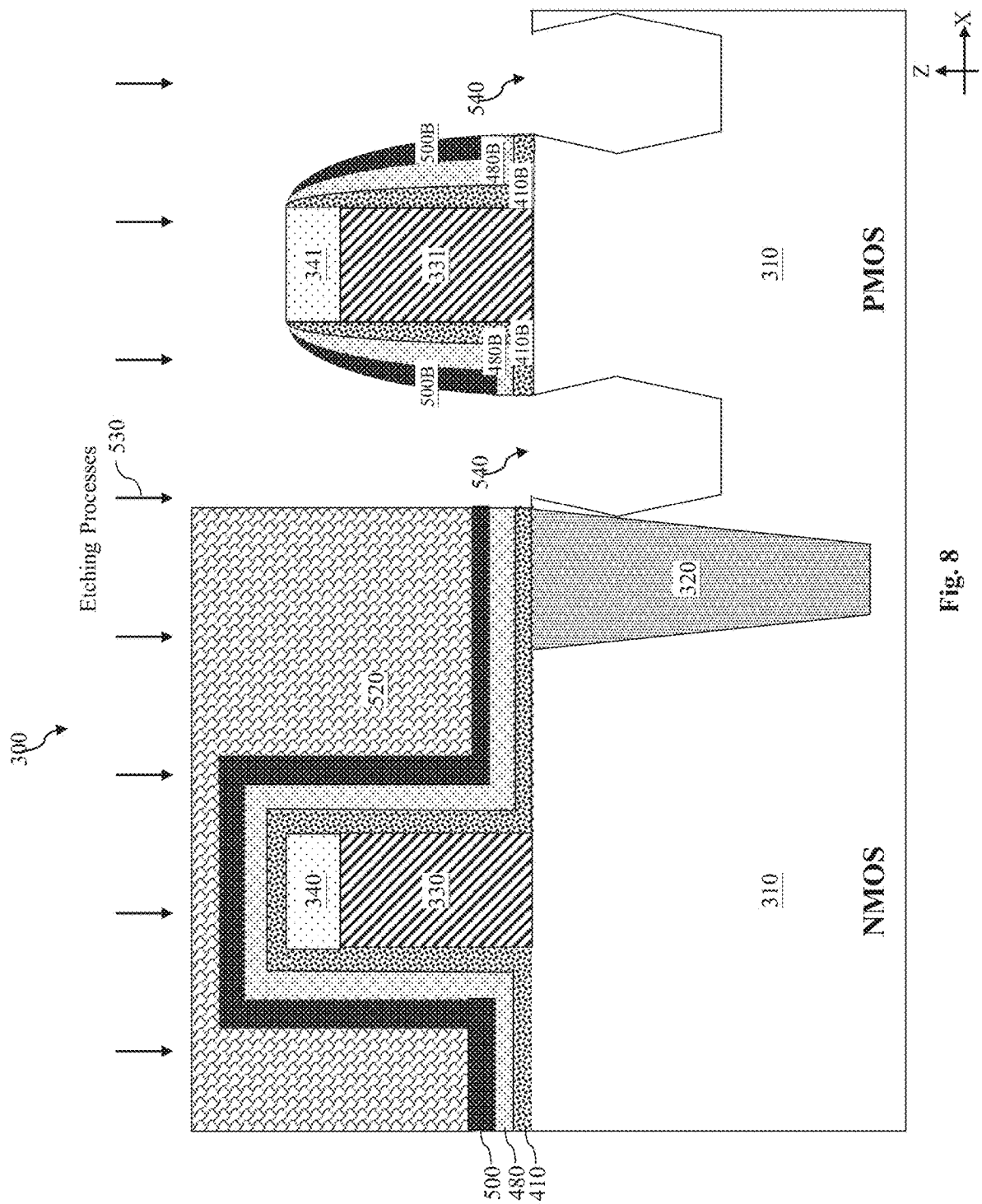

Referring now to FIG. 8, a patterned photoresist mask 520 is formed over the NMOS side of the semiconductor device 300. For example, the patterned photoresist mask 520 is formed over the spacer layer 500 of the NMOS. After the formation of the patterned photoresist mask 520, a plurality of etching processes 530 is performed to the semiconductor device 300. In various embodiments, the etching process 530 may include wet etching processes and/or dry etching processes. With the patterned photoresist mask 520 serving as an etching mask, a first etching process of the etching processes 530 etches away portions of the spacer layers 500, 480, and 410 that are disposed around the gate 331. The remaining portions of the spacer layers 500B, 480B, and 410B form gate spacers for the gate 331. These remaining portions of the spacer layers 500B, 480B, and 410B may also be interchangeably referred to as gate spacers 500B, 480B, and 410B hereinafter. The upper surface of the hard mask 341 is also exposed by the first etching process. After the gate spacers 500B, 480B, and 410B are formed, a second etching process of the etching processes 530 forms recesses 540 in the substrate 310 on the PMOS side of the semiconductor device 300. During the performance of the etching processes 530, the components on the NMOS side of the semiconductor device 300 are protected by the patterned photoresist mask 520 and are therefore not etched.

Figure 9:
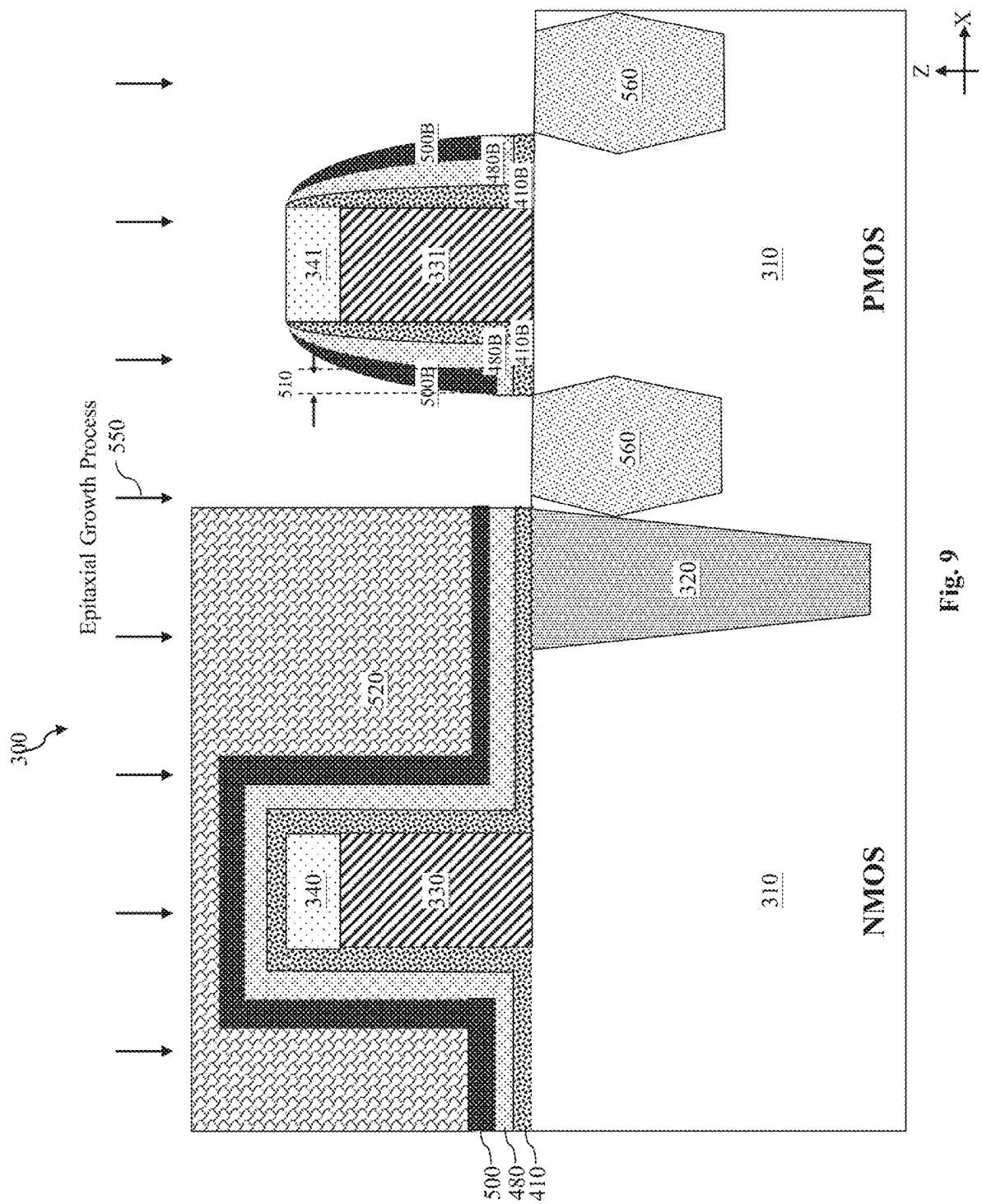

Referring now to FIG. 9, an epitaxial growth process 550 is performed to epitaxially grow source/drain regions 560 in the recesses 540. The source/drain regions 560 are grown on the substrate 310 and serve as the source/drain regions of the PMOS. In some embodiments, the source/drain regions 560 may contain silicon germanium (SiGe).

Figure 10:
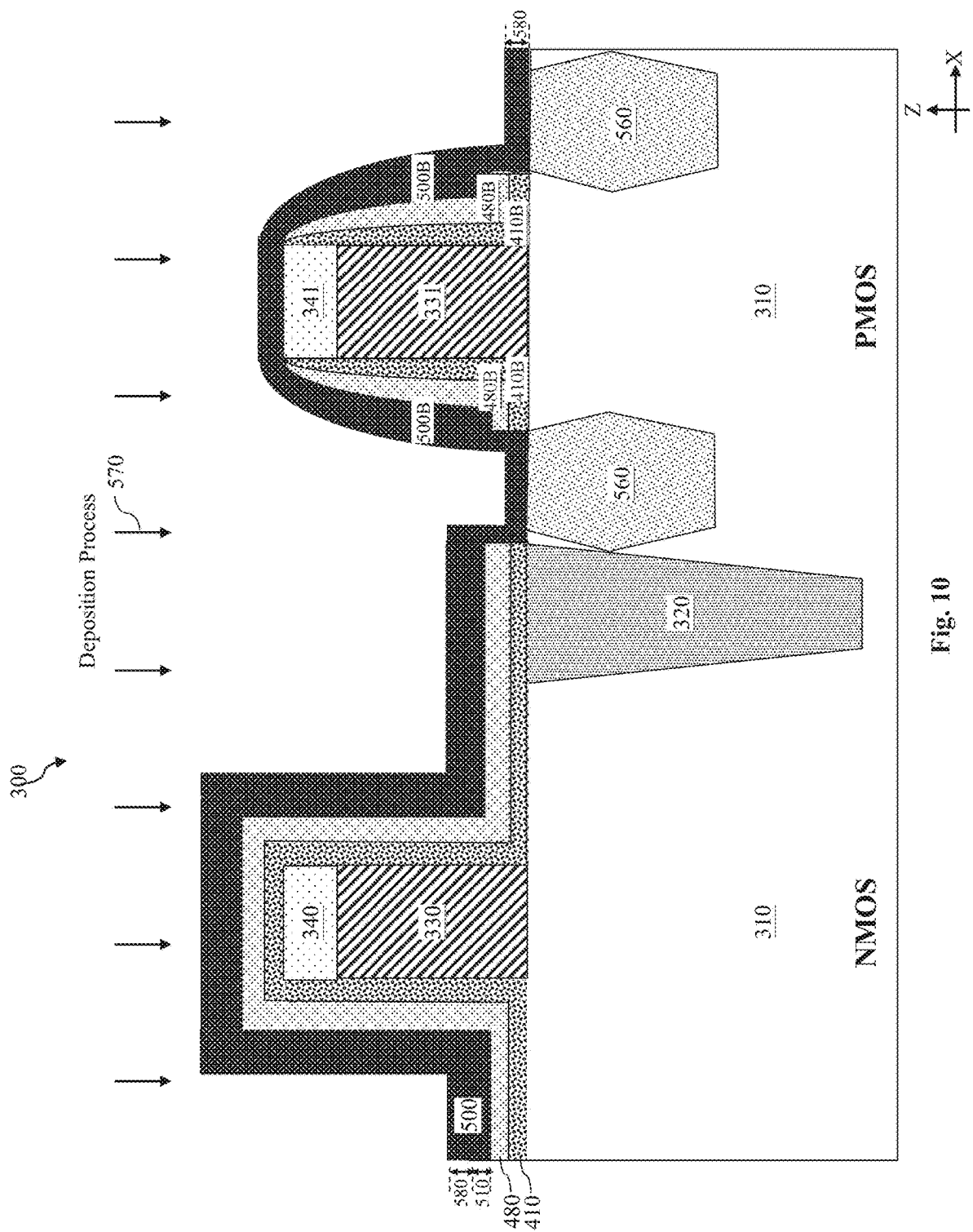

Referring now to FIG. 10, a deposition process 570 is performed to thicken the spacer layer 500 (including the gate spacers 500B on the PMOS side). In other words, the deposition process 570 deposits an additional layer of materials that has substantially the same material composition as the spacer layer 500. In some embodiments, the originally formed spacer layer 500 and the newly deposited material by the deposition process 570 both contain silicon nitride ($Si_3N_4$). The newly deposited portion of the spacer layer 500 has a thickness 580. In some embodiments, the thickness 580 is in a range between about 100 angstroms and about 120 angstroms. In some embodiments, a ratio between the thickness 580 and the thickness 420 (i.e., the thickness of the spacer layer 410) is in a range from about 3.33:1 to about 6:1. Note that these ranges are not randomly chosen but are specifically configured to facilitate the threshold voltage tuning, as discussed below in more detail.

It is understood that in some embodiments, the deposition process 570 need not be performed. In other words, the performance of the deposition process 570 is optional. However, the inventors of the present disclosure have recognized that the embodiments where the deposition process 570 is performed may have increased yield.

Figure 11:
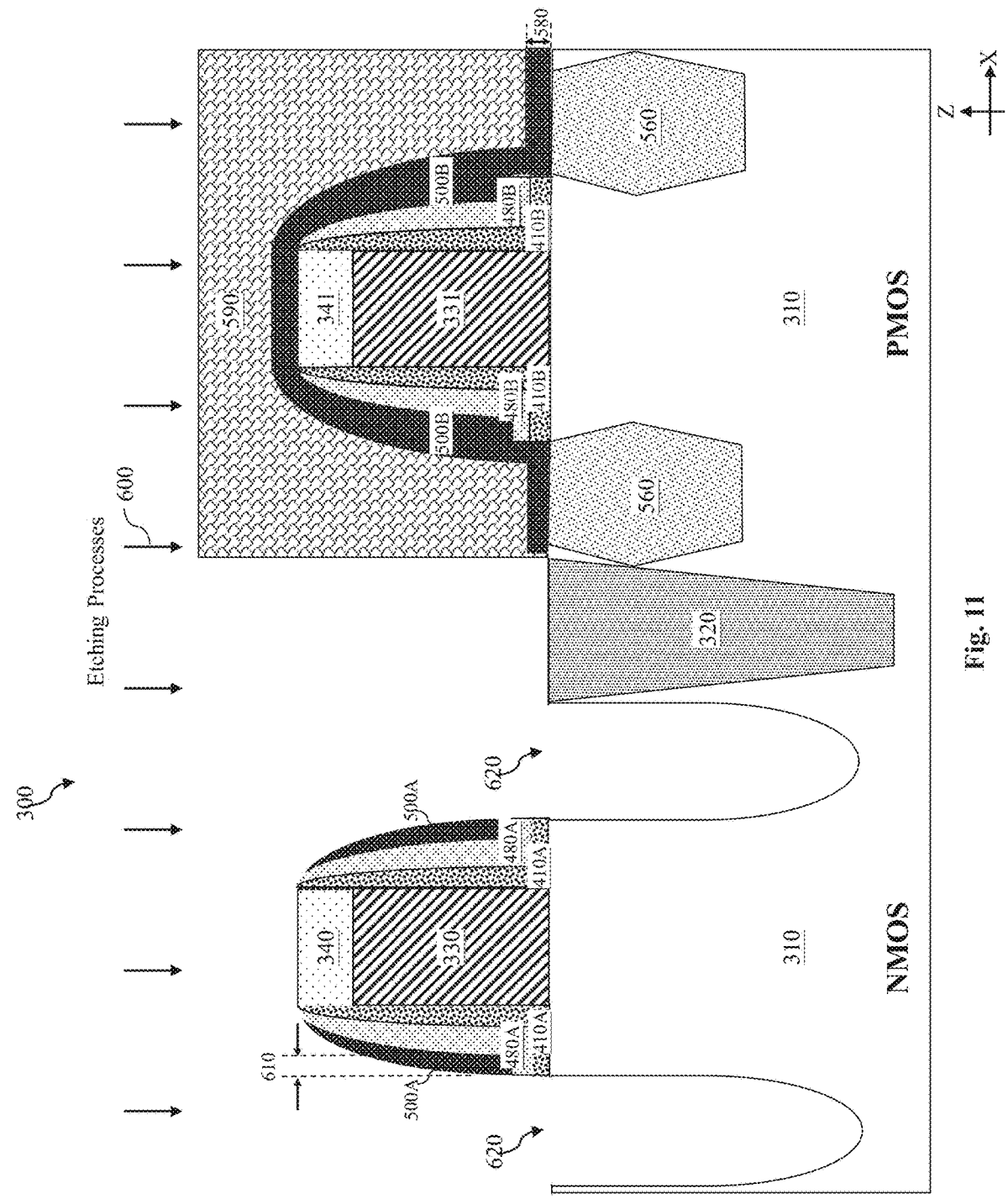

Referring now to FIG. 11, a patterned photoresist mask 590 is formed over the PMOS side of the semiconductor device 300. For example, the patterned photoresist mask 590 is formed over the spacer layer 500 of the PMOS. After the formation of the patterned photoresist mask 590, a plurality of etching processes 600 is performed to the semiconductor device 300. In some embodiments, the etching process 600 may include wet etching processes and/or dry etching processes. With the patterned photoresist mask 590 serving as an etching mask, a first etching process of the etching processes 600 etches away portions of the spacer layers 500, 480, and 410 that are disposed around the gate 330. The remaining portions of the spacer layers 500A, 480A, and 410A form gate spacers for the gate 330. These remaining portions of the spacer layers 500A, 480A, and 410A may also be interchangeably referred to as gate spacers 500A, 480A, and 410A hereinafter. The upper surface of the hard mask 340 is also exposed by the first etching process.

According to embodiments of the present disclosure, the first etching process of the etching processes 600 is configured to etch away portions of the spacer layer 500 over the NMOS, such that the gate spacer 500A is substantially thinner than the gate spacer 500B. In some embodiments, this may be achieved by configuring the etching duration or other etching parameters of the first etching process of the etching processes 600, for example by lengthening the etching duration. For example, the etching process performed to etch the spacer layer 500A may be performed with a substantially longer duration than the etching process performed to etch the spacer layer 500B. As a result, the gate spacer 500A has a thickness (or lateral dimension) 610. In some embodiments, the thickness 610 is in a range between about 20 angstroms and about 30 angstroms. If the thickness 610 is outside of this range, it may risk the spacer 500A being inadvertently etched away entirely (if the thickness 610 is too thin), or the spacer 500A not having a sufficient thickness difference with the spacer 500B (if the thickness 610 is too thick). Compared to conventional spacers and compared to the gate spacer 500B of the PMOS, the gate spacer 500A of the NMOS is substantially thinner (e.g., at least twice as thin). One reason for the reduced thickness is to effectively shorten the channel length of the NMOS, which will help adjust the threshold voltage, as will be discussed in greater detail below.

Still referring to FIG. 11, after the gate spacers 500A, 480A, and 410A are formed, a second etching process of the etching processes 600 forms recesses 620 in the substrate 310 on the NMOS side of the semiconductor device 300. During the performance of the etching processes 600, the components on the PMOS side of the semiconductor device 300 are protected by the patterned photoresist mask 590 and are therefore not etched.

Figure 12:
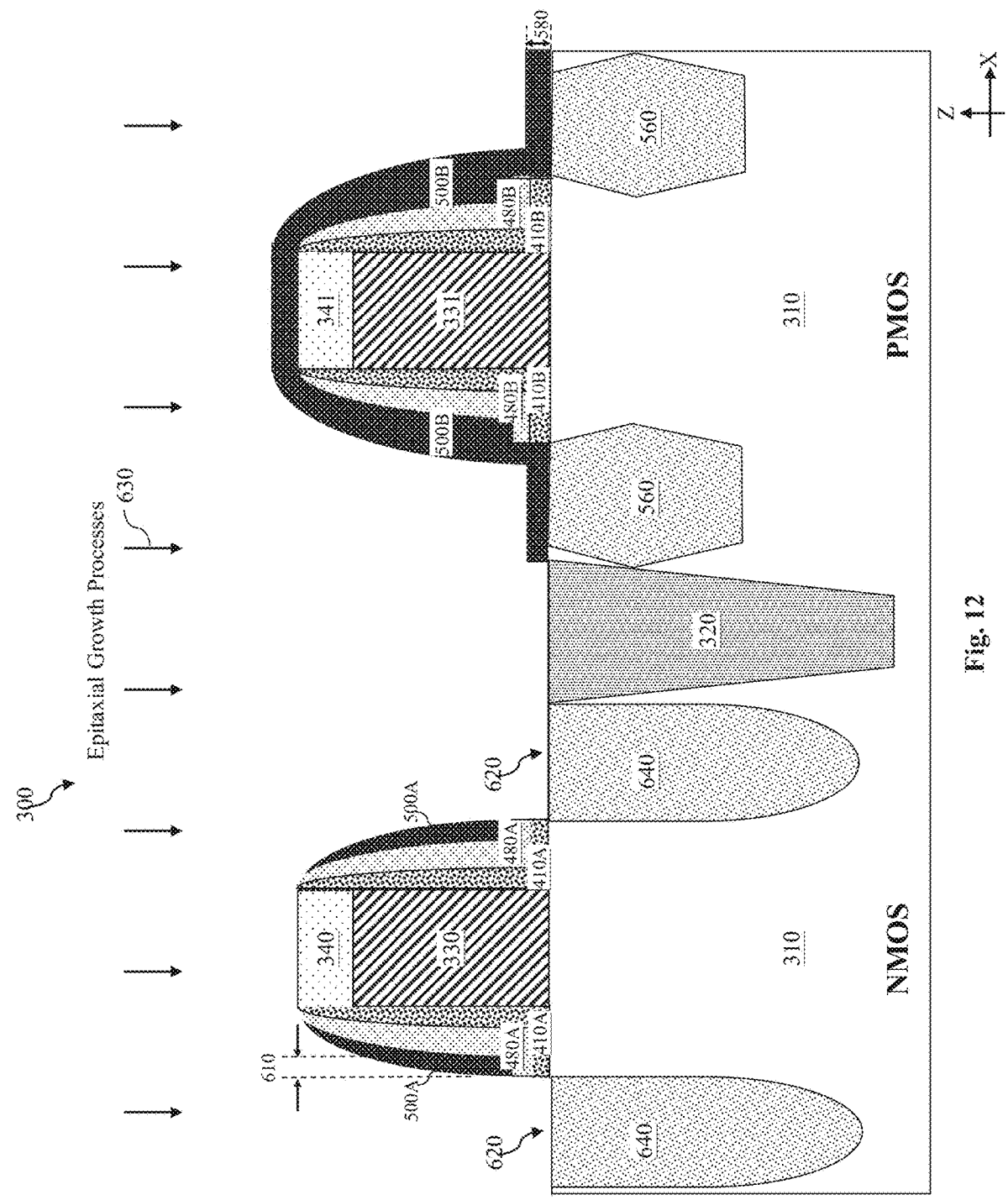

Referring now to FIG. 12, an epitaxial growth step of a process 630 is performed to epitaxially grow source/drain regions 640 in the recesses 620. The source/drain regions 640 are grown on the substrate 310 and serve as the source/drain regions of the NMOS. In some embodiments, the source/drain regions 640 may contain silicon phosphorous (SiP). Thereafter, the patterned photoresist mask 590 is removed, for example using a stripping or ashing process.

Figure 13:
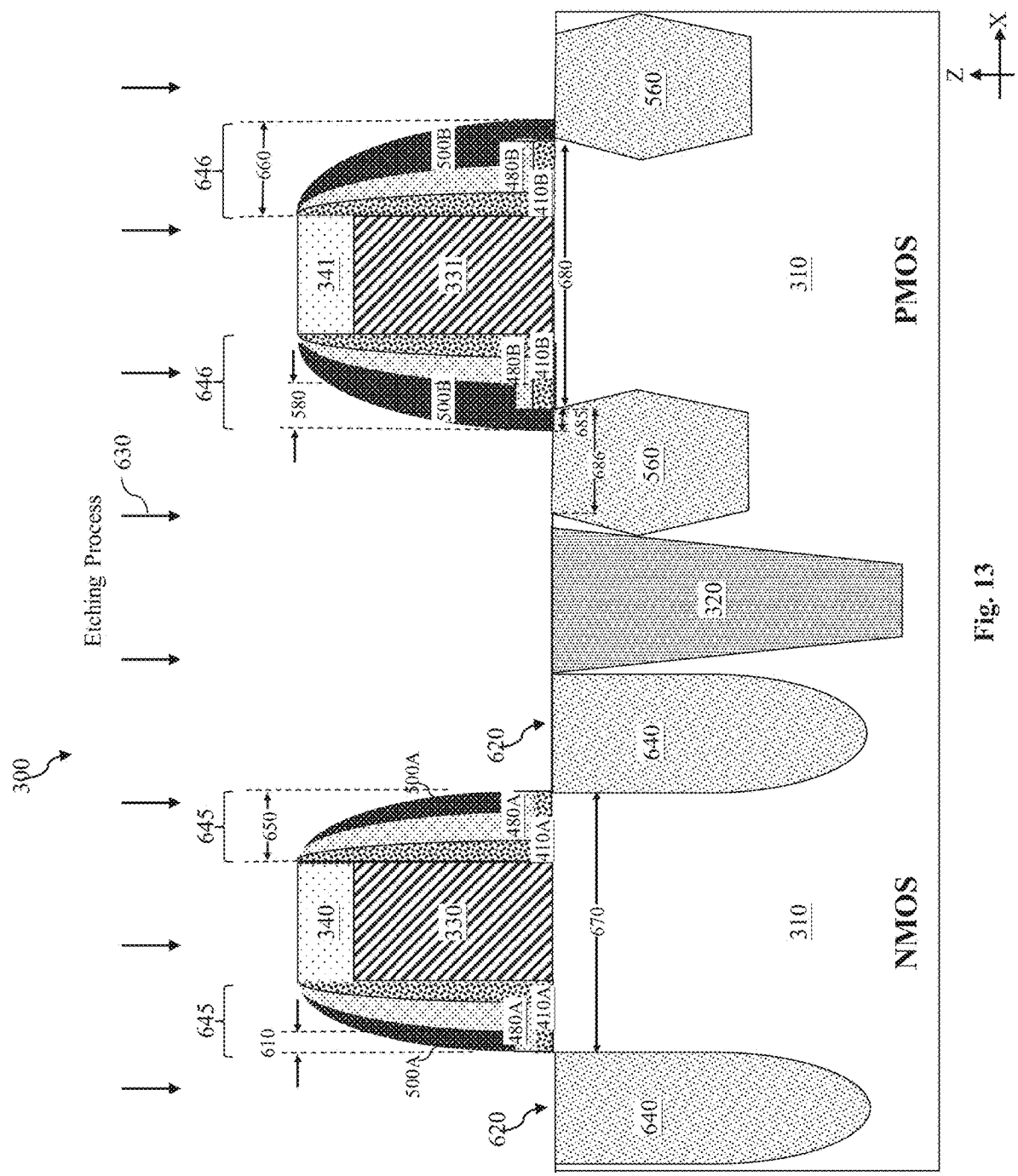

Referring now to FIG. 13, an etching step of the process 630 is performed to the semiconductor device 300 to remove portions of the spacer layer 500 disposed over the hard mask 341, as well as portions of the spacer layer 500 other than the gate spacers 500B. At this point, the NMOS has a gate spacer structure 645 that is made up of the gate spacers 410A, 480A, and 500A, whereas the PMOS has a gate spacer structure 646 that is made up of the gate spacers 410B, 480B, and 500B.

The gate spacer structure 645 of the NMOS is substantially thinner or narrower (in the X-direction) than the gate spacer structure 646 of the PMOS. As is shown in FIG. 13, the gate spacer structure 645 of the NMOS has a lateral dimension 650, which is a sum of the lateral dimensions of the gate spacers 410A, 480A, and 500A. In some embodiments, the lateral dimension 650 may be defined or measured as the distance or dimension from an outermost point of an exterior surface of the gate spacer structure 645 (e.g., the point on which the gate spacer 500A protrudes the most away from the gate structure 700 in the X-direction) to the nearest sidewall of the gate structure 700. The gate spacer structure 646 of the PMOS has a lateral dimension 660, which is a sum of the lateral dimensions of the gate spacers 410B, 480B, and 500B. In some embodiments, the lateral dimension 660 may be defined or measured as the distance or dimension from an outermost point of an exterior surface of the gate structure 646 (e.g., the point on which the gate spacer 500B protrudes the most away from the gate structure 701 in the X-direction) to the nearest sidewall of the gate structure 701. The lateral dimensions 650 and 660 may also be referred to as maximum lateral dimensions. In some embodiments, the lateral dimension 650 is in a range between about 40 angstroms and about 70 angstroms, and the lateral dimension 660 is in a range between about 120 angstroms and about 160 angstroms. In some embodiments, a ratio between the lateral dimension 650 and the lateral dimension 660 is in a range between about 1:4 and about 7:12. If these dimensions are outside of the above ranges, then the sizes between the gate spacer structures 645 and 646 may not have been sufficiently different to allow room for spacer thickness tuning (which is used to tune threshold voltage), as discussed in more detail below. The reason that the lateral dimension 660 is substantially greater than the lateral dimension 650 is because the lateral dimension 580 of the gate spacer 500B is substantially greater than the lateral dimension 610 of the gate spacer 500A, since the lateral dimensions of the gate spacers 410A and 410B are substantially equal to one another, and the lateral dimensions of the gate spacers 480A and 480B are substantially equal to one another.

The size difference between the gate spacers 500A and 500B (and in turn, between the overall gate spacer structures 645-646 of the NMOS and PMOS) is not a random result of fabrication but rather is specifically configured to help tune different threshold voltages for the NMOS and the PMOS. In more detail, the source/drain regions 640 of the NMOS are separated from one another by a distance 670, which also corresponds to a channel length of the NMOS. The source/drain regions 560 of the PMOS are separated from one another by a distance 680, which corresponds to a channel length of the PMOS. The distance 670 is substantially shorter than the distance 680 due to the thinner gate spacers 500A, since the boundaries of the source/drain regions 640 are defined by (and aligned with) the outer surfaces of the gate spacers 500A. As such, as the lateral dimension 610 of the gate spacers 500A (and the lateral dimension 650 of the overall NMOS gate spacer structure 645) is reduced, the distance 670 is reduced as well.

In comparison, when the source/drain regions 560 are formed (see FIG. 9), the gate spacers 500B has a lateral dimension 510 that is substantially greater than the thickness 610 of the gate spacer 500A. As a result, the distance 680 separating the source/drain regions 560 is greater than the distance 670 separating the source/drain regions 640. The shorter channel of the NMOS (compared to the PMOS) means that the threshold voltage is lower for the NMOS than for the PMOS, which means that the $Id_{sat}$ for the NMOS is greater than the $Id_{sat}$ for the PMOS. The greater $Id_{sat}$ for the NMOS (corresponding to the PG transistors) and/or the lower $Id_{sat}$ for the PMOS (corresponding to the PU transistors) means that the alpha ratio can be decreased, which helps to alleviate the write margin of the SRAM. In some embodiments, a ratio between the distance 670 and the distance 680 is in a range between about 0.6:1 and about 0.9:1. Such a ratio range is not randomly chosen but specifically configured to ensure that the threshold voltages and $Id_{sat}$ for the NMOS and the PMOS can be correctly tuned to achieve the desired alpha ratio.

Note that in embodiments where the deposition process 470 is performed (such as in the illustrated embodiment), a unique physical characteristic of the semiconductor device as a result of the fabrication is that parts of the bottom surface of the gate spacers 500B are in direct physical contact with parts of the top surfaces of the source/drain regions 560. This is a because the boundaries of the source/drain regions 560 are defined before the gate spacers 500B are thickened by the deposition process 470. Therefore, the thickened portion of the gate spacers 500B are formed over parts of the source/drain regions 560. As shown in FIG. 13, a region of an overlap between the gate spacer 500B and the source/drain region 560 has a dimension 685, while an upper surface of the source/drain region 560 has a dimension 686, both of which are measured in the X-direction. In some embodiments, the dimension 685 is in a range between 5 nm and about 10 nm, and the dimension 686 is in a range between about 20 and about 40 nm, and a ratio of the dimension 685 and the dimension 686 is in a range between about 0.125:1 and about 0.5:1. Note that these ranges are not randomly chosen but specifically configured according to various aspects of the present disclosure. If the dimensions 586/686 or their ratio deviate outside the ranges, then that may indicate the deposition process 470 may not have been performed satisfactorily to thicken the gate spacers 500B, or that the gate spacers 500B have been thickened too much so as to potentially interfere with the formation of source/drain contacts over the source/drain regions 560. In comparison, the boundaries of the source/drain regions 640 of the NMOS may be more aligned with the outer surfaces of the gate spacers 500A. However, it is understood that in real world devices, some portions of the source/drain regions 640 may diffuse laterally outward such that some portions of the source/drain regions 640 may be disposed under the gate spacers 410A. The same may be true for the source/drain regions 560 of the PMOS, such that the source/drain regions 560 may be disposed under the gate spacers 410B. Nevertheless, the amount of overlap between the source/drain regions 560 and the gate spacer structure 646 above (including the gate spacers 410B and 500B) may still be greater than the amount of overlap between the source/drain regions 640 and the gate spacer structure 645 above (including the gate spacers 410A and 500A).

Figure 14:
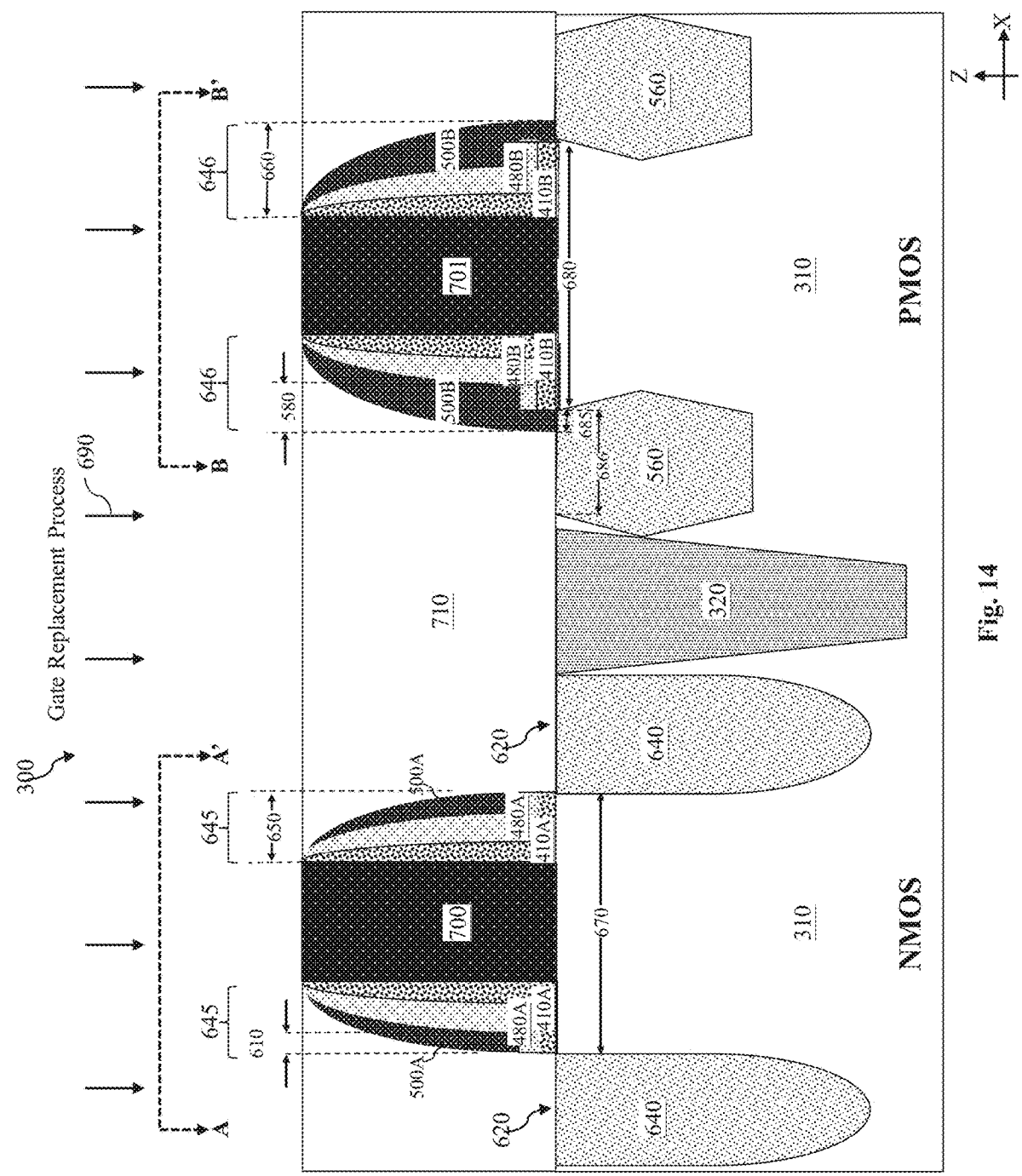
Figure 15:
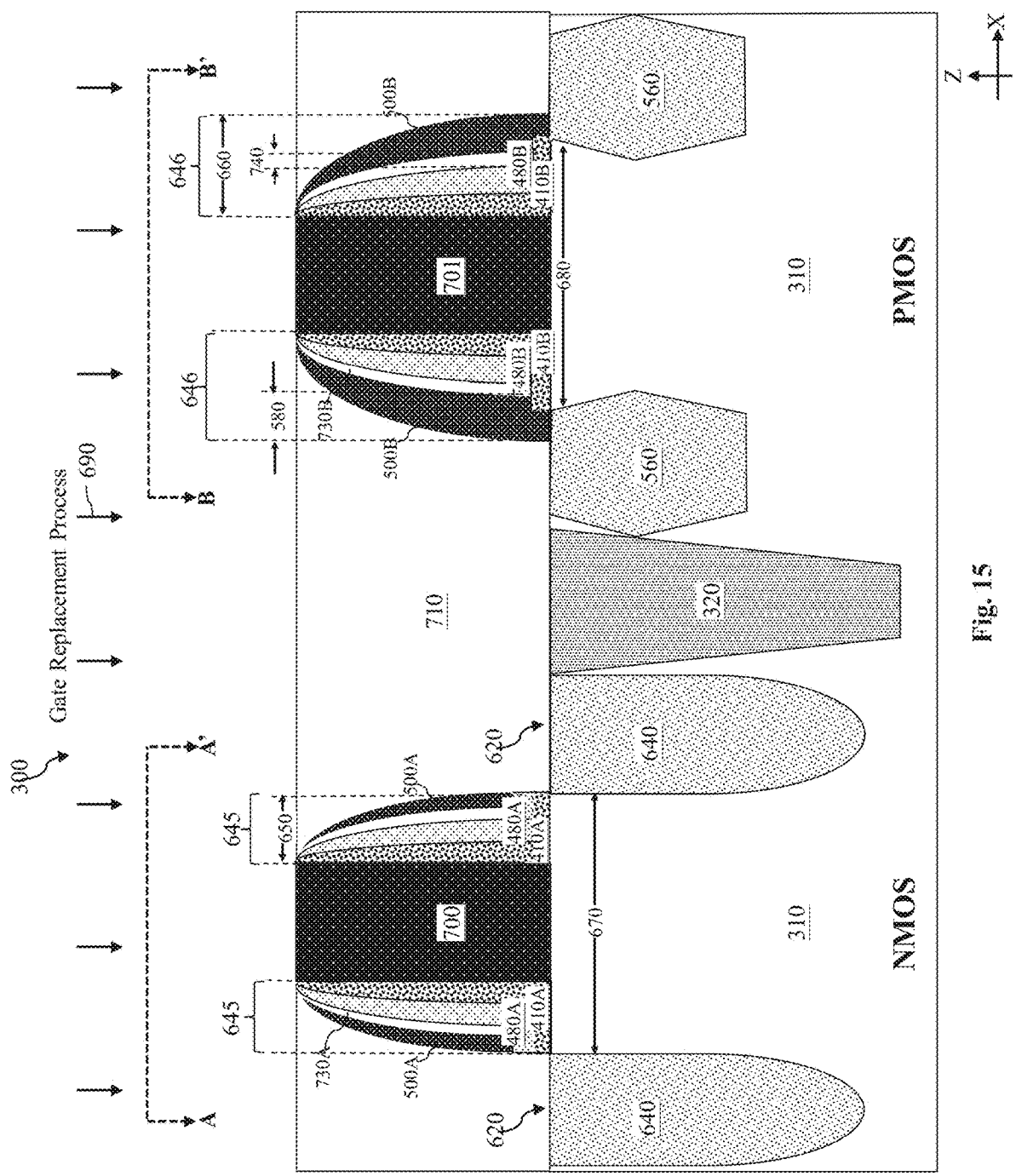

Referring now to FIG. 14, a gate replacement process 690 is performed to the semiconductor device 300 to remove the dummy gate structures 330 and 331 and replace them with high-k metal-gate (HKMG) structures 700 and 701, respectively. As a part of the gate replacement process 690, an interlayer dielectric (ILD) 710 may be formed around the dummy gate structures 330-331 first. The dummy gate structures 330-331 (and the hard masks 340-341) may then be removed using etching processes, which leaves openings (trenches) in the ILD 710. These openings or trenches are subsequently filled by the HKMG structures 700-701.

The HKMG structures 700-701 may each include a high-k gate dielectric and a metal gate electrode. Example materials of the high-k gate dielectric include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or combinations thereof. The metal gate electrode may include one or more work function metal layers and one or more fill metal layers. The work function metal layers may be configured to tune a work function of the respective transistor. Example materials for the work function metal layers may include titanium nitride (TiN), Titanium aluminide (TiAl), tantalum nitride (TaN), titanium carbide (Tic), tantalum carbide (TaC), tungsten carbide (WC), aluminum titanium nitride (TiAlN), zirconium aluminide (ZrAl), tungsten aluminide (WAl), tantalum aluminide (TaAl), hafnium aluminide (HfAl), or combinations thereof. The fill metal layer may serve as a main conductive portion of the gate electrode layer 260. In some embodiments, the HKMG structures 700-701 may include additional layers, such as interfacial layers, capping layers, diffusion/barrier layers, or other applicable layers.

According to some embodiments of the present disclosure, air spacers may also be formed as a part of the gate spacer structures 645 and/or 646. For example, referring now to FIG. 15, air spacers 730A and 730B may be formed as a part of the gate spacer structures 645 and 646 for the NMOS and the PMOS, respectively. The formation of the air spacers 730A and 730B may involve the following steps. First, at a fabrication stage similar to that shown in FIG. 7, a dummy semiconductive layer such as a silicon layer may be formed on the spacer layer 480 before the spacer layer 500 is formed. In other words, the dummy semiconductive layer may be formed between the spacer layers 480 and 500. Thereafter, at a fabrication stage similar to that shown in FIG. 8, the etching processes 530 etch away portions of the dummy semiconductive layer disposed over the PMOS to form the air spacers 730B. At a fabrication stage similar to that shown in FIG. 11, the etching processes 600 etch away portions of the dummy semiconductive layer disposed over the NMOS to form the air spacers 730A.

The air spacers 730A and 730B help lower the parasitic capacitance of the NMOS and PMOS. This is because air has a low dielectric constant of 1.00059, which is substantially lower than the dielectric materials of the other gate spacers 500A/B, 480A/B, and 410A/B. Since dielectric constant is directly correlated with capacitance, the presence of the air spacers 730A and 730B in the gate spacer structures 645 and 646 will reduce the overall dielectric constant and thus the overall parasitic capacitance of the NMOS and PMOS. For SRAM devices such as the semiconductor device 300, speed is an important parameter. Speed of the SRAM is determined at least in part by an RC constant, where R represents resistance and C represents capacitance (including the parasitic capacitance). Here, the air spacers 730A and 730B help reduce the RC constant by the reduction in the parasitic capacitance, thereby improving the speed of the SRAM device.

The overall dielectric constant of the gate spacer structures 645 and 646 herein may also be tuned by adjusting a thickness 740 of each the air spacers 730A/730B. The greater the thickness 740, the greater the reduction in the overall dielectric constant of the gate spacer structures 645 and 646, at the expense of increasing device sizes. In some embodiments, a ratio between the thickness 740 of the air spacers 730A/730B and the thickness 580 of the gate spacer 500B is in a range between about 0.25:1 and about 0.35:1. In some embodiments, a ratio between the thickness 740 of the air spacers 730A/730B and the thickness 660 of the overall gate spacer structure 646 of the PMOS is in a range between about 0.05:1 and about 0.08:1. It is understood that these ranges are not randomly chosen but specifically configured to ensure that the dimensions/sizes of the air spacers 730A/730B are optimized to achieve a meaningful amount of parasitic capacitance reduction (and therefore SRAM speed enhancement) without unduly sacrificing chip real estate. If the ratios are outside of the above ranges, then the parasitic capacitance reduction may not be meaningful or significant (if the ratios are less than the ranges), or too much chip real estate will be consumed (if the ratios are larger than the ranges).

FIGS. 16 and 17 illustrate diagrammatic fragmentary top views of a portion of the semiconductor device 300 according to embodiments of the present disclosure. In more detail, FIG. 16 is the top view corresponding to the embodiment shown in FIG. 14 (i.e., the embodiment without air spacers), and FIG. 17 is the top view corresponding to the embodiment shown in FIG. 15 (i.e., the embodiment with air spacers). Both FIGS. 16-17 illustrate a top view of a 6T-SRAM cell (i.e., an SRAM cell made up of six transistors: PD1, PD2, PU1, PU2, PG1, and PG2). The top views shown in FIGS. 16-17 are taken across a plane defined by the X-direction (vertically in FIGS. 16-17) and the Y-direction (horizontally in FIGS. 16-17). For reasons of consistency and clarity, similar components appearing in FIGS. 4-15 will be labeled the same in FIGS. 16-17. It is also understood that the NMOS in FIGS. 4-15 corresponds to the cross-section taken along the cutline A-A' in FIGS. 16-17, and that the PMOS in FIGS. 4-15 corresponds to the cross-section taken along the cutline B-B' in FIGS. 16-17 As discussed above, these cross-sectional views of the NMOS and the PMOS are separated from each other in the Y-direction, but they are shown simultaneously in FIGS. 4-15 for reasons of simplicity.

Referring to FIG. 16, the NMOS devices, including PG1, PG2, PD1, and PD2 are disposed over the substrate 310, which may be a P-type doped substrate. Meanwhile, the PMOS devices, including PU1 and PU2, are disposed over an N-well, which is a portion of the substrate 310 that is doped with an N-type dopant. A plurality of active regions 750 are illustrated in FIGS. 16-17, which each extend in an elongated manner in the X-direction. In some embodiments, the active regions 750 may include the fin structures of FinFETs discussed above with reference to FIG. 2. It is understood that the source/drain regions 640 and 560 discussed above may also be formed (e.g., epitaxially grown) on portions of the fin structures.

FIGS. 16-17 also illustrate gate structures 700 and 701 that each extend in an elongated manner in the Y-direction and overlap with the fin structures 750 in the top view. The gate structures 700 and 701 may each wrap around respective ones of the fin structures 750 in a manner similar to that shown in FIG. 2. Per SRAM layout design, a discontinuity exists between the gate structures 700 and 701 of PG1 and PU2, and another discontinuity exists between the gate structures 700 and 701 of PG2 and PU1. Undesirable electrical shorting would be created without such discontinuity. The gate spacer structures 645 are formed on sidewalls of the gate structures 700, and the gate spacer structures 646 are formed on sidewalls of the gate structures 701. The difference in the thicknesses 650 and 660 of the gate spacer structures 645 and 646 is also clearly shown in FIGS. 16-17. As discussed above, a ratio between the thickness 650 and the thickness 660 is in a range between about 1:4 and about 7:12. Again, this ratio range is not randomly chosen but specifically configured to arrive at a desired threshold voltage for both the NMOS and the PMOS, so that the alpha ratio can be tuned to optimize the write margin and/or read margin of the SRAM device. If the ratio is less than 1:4 or greater than 7:12, then there may not be sufficient room to tune the alpha ratio, or the consumption of valuable chip real estate may be excessive.

FIGS. 16-17 illustrate another reason why it may be advantageous to use the different gate spacer thicknesses to tune threshold voltages, rather than relying on work function metals alone to tune it. As is shown in FIGS. 16-17, the gate structure 701 of PU1 is in direct physical contact with the gate structure 700 of PD1, and the gate structure 701 of PU2 is in direct physical contact with the gate structure 700 of PD2. Since the gate structures 700 and 701 are parts of different types of transistors (e.g., parts of a PMOS and an NMOS, respective) and have different types of work function metals, any metal inter-diffusion between the gate structures 700 and 701 due to their direct physical contact may be undesirable, as it may affect the intended functionality of the gate metal electrode.

For example, in an embodiment where the gate structure 700 contains TiN as its work function metal and where the gate structure 701 contains TiAl as its work function metal, the aluminum in the gate structure 701 may diffuse into the metal gate electrode of the gate structure 700 disposed adjacent thereto. This may affect the threshold voltages of the NMOS and the PMOS associated with the gate structures 700 and 701, which then could adversely affect the performance of the SRAM device. As device sizes continue to shrink, such an undesirable diffusion is more likely to occur and more difficult to prevent. As such, relying on work function metals alone to tune the threshold voltages may lack the precision or flexibility needed with threshold voltage tuning. In comparison, the present disclosure uses the different gate spacer thicknesses to tune threshold voltage, in addition to or instead of using the work function metal layers. As such, the present disclosure may achieve greater precision and flexibility with respect to threshold voltage tuning.

FIG. 18 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such an EUV tool that is used to perform lithography processes to define the gate spacers of an SRAM device; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

FIG. 19 is a flowchart illustrating a method 1000 of manufacturing a semiconductor device. The method 1000 includes a step 1010 of forming a plurality of spacer layers over a first gate of an N-type transistor and over a second gate of a P-type transistor.

The method 1000 includes a step 1020 of forming a first protective mask that covers the N-type transistor.

The method 1000 includes a step 1030 of etching the plurality of spacer layers over the P-type transistor to form a second gate spacer structure around the second gate. The second gate spacer structure is formed to have a second lateral dimension. The first protective mask protects the N-type transistor from being etched.

The method 1000 includes a step 1040 of removing the first protective mask and forming a second protective mask that covers the P-type transistor.

The method 1000 includes a step 1050 of etching the plurality of spacer layers over the N-type transistor to form a first gate spacer structure around the first gate. The first gate spacer structure is formed to have a first lateral dimension that is substantially less than the second lateral dimension. The second protective mask protects the P-type transistor from being etched.

In some embodiments, the forming of the plurality of spacer layers comprises forming a plurality of dielectric layers and a semiconductive layer as the plurality of spacer layers. The semiconductive layer is formed between the plurality of dielectric layers. In some embodiments, the etching the plurality of spacer layers comprises etching away the semiconductive layer to form air spacers as a part of the first gate spacer structure and as a part of the second gate spacer structure.

In some embodiments, the forming the plurality of spacer layers comprises forming the plurality of spacer layers over a pass-gate (PG) device of a static random access memory (SRAM) and over a pull-up (PU) device of the SRAM. The PG device includes the N-type transistor. The PU device includes the P-type transistor.

It is understood that additional steps may be performed before, during, or after the steps 1010-1050. For example, the method 1000 may include the steps of: forming second source/drain regions of the P-type transistor after the second gate spacer structure has been formed, wherein the first protective mask is removed after the second source/drain regions have been formed; and forming first source/drain regions of the N-type transistor after the first gate spacer structure has been formed, wherein the second protective mask is removed after the first source/drain regions have been formed. In some embodiments, the first source/drain regions are formed to have a first channel length, and the second source/drain regions are formed to have a second channel length greater than the first channel length. As another example of the additional steps, the method 1000 may include the steps of: after the second gate spacer structure has been formed but before the first gate spacer structure has been formed, depositing a dielectric material over the N-type transistor and over the P-type transistor; and after the first gate spacer structure and the second gate spacer structure have been formed, performing a gate replacement process to replace the first gate and the second gate with a first metal-containing gate and a second metal-containing gate, respectively. Other steps may include formation of vias, contacts, or metal layers, etc.

In summary, the present disclosure forms a semiconductor device with different gate spacer thicknesses between the NMOS and the PMOS. In some embodiments, the gate spacers of the NMOS are etched more than the gate spacers of the PMOS, such that the NMOS has a thinner gate spacer structure than the PMOS. The thinner NMOS gate spacer structure leads to a shorter channel length for the NMOS, which allows the NMOS to have a smaller threshold voltage than the PMOS. As such, the present disclosure achieves threshold voltage tuning not just by relying solely on work function metals of metal gate electrodes, but also by the gate spacer thicknesses. Additionally, the present disclosure may form air spacers as a part of the overall gate spacer structure.

Based on the above discussions, it can be seen that the embodiments of the present disclosure offer advantages over conventional devices. It is understood, however, that no particular advantage is required, other embodiments may offer different advantages, and that not all advantages are necessarily disclosed herein.

On advantage is improved device performance. For example, as a write margin is an important for SRAM devices, it may be desirable for SRAM devices to lower the alpha ratio (defined as PU's $Id_{sat}$ divided by PG's $Id_{sat}$) to achieve the desired write margin of the SRAM, even if that means the read margin may be sacrificed slightly. Since $Id_{sat}$ is an inverse function of a threshold voltage (Vt), the threshold voltage may be tuned to arrive at the desired $Id_{sat}$ for both the NMOS and the PMOS. As device sizes continue to get scaled down, it may become infeasible to tune threshold voltages using work function metals alone, as problems may arise such as metal inter-diffusion between PMOS and NMOS devices, and/or inadequate gap filling performance when the work function metals are formed in a gate electrode. Here, the present disclosure overcomes these problems by using different gate spacer thicknesses to tune the threshold voltages. Such a method avoids the problems associated with using work function metals alone to tune threshold voltages. As a result, the SRAM devices of the embodiments herein may achieve an optimized write margin and read margin, alone with other benefits associated with flexible threshold voltage tuning. Another benefit is the improvement in SRAM speed. As discussed above, SRAM speed may be adversely affected by device parasitic capacitance. Here, by implementing air gate spacers (which have a much lower dielectric constant than other types of dielectric gate spacers), the overall parasitic capacitance is lowered, which improves SRAM speed. Other advantages may include ease of fabrication and compatibility with existing fabrication processes.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

One aspect of the present disclosure involves a semiconductor device. The semiconductor device includes an N-type metal oxide semiconductor (NMOS) transistor and a P-type metal oxide semiconductor (PMOS) transistor. The NMOS transistor includes a first gate and a first spacer structure disposed on sidewalls of the first gate in a first direction. The first spacer structure has a first thickness in the first direction. The PMOS transistor includes a second gate and a second spacer structure disposed on sidewalls of the second gate in the first direction. The second spacer structure has a second thickness that is greater than the first thickness.

Another aspect of the present disclosure involves a semiconductor device. The semiconductor device includes a static random access memory (SRAM) that includes at least a pass-gate (PG) transistor and a pull-up (PU) transistor. The PG transistor includes a first gate disposed over a substrate, a first gate spacer structure disposed on sidewalls of the first gate, and first source/drain regions disposed in the substrate. The PU transistor includes a second gate disposed over the substrate, a second gate spacer structure disposed on sidewalls of the second gate, and second source/drain regions disposed in the substrate. The first gate spacer structure has a first lateral dimension. The second gate spacer structure has a second lateral dimension substantially greater than the first lateral dimension.

Yet another aspect of the present disclosure involves a method of fabricating a semiconductor device. A plurality of spacer layers is over a first gate of an N-type transistor and over a second gate of a P-type transistor. A first protective mask is formed that covers the N-type transistor. The plurality of spacer layers is etched over the P-type transistor to form a second gate spacer structure around the second gate. The second gate spacer structure is formed to have a second lateral dimension. The first protective mask protects the N-type transistor from being etched. The first protective mask is removed, and a second protective mask is formed that covers the P-type transistor. The plurality of spacer layers over the N-type transistor is etched to form a first gate spacer structure around the first gate. The first gate spacer structure is formed to have a first lateral dimension that is substantially less than the second lateral dimension. The second protective mask protects the P-type transistor from being etched.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A semiconductor device, comprising:
   an N-type metal oxide semiconductor (NMOS) transistor, wherein the NMOS transistor includes a first gate and a first spacer structure disposed on a sidewall of the first gate in a first direction, wherein the first spacer structure has a first thickness in the first direction, wherein the first thickness is measured from an outermost point of an outer surface of the first spacer structure to the sidewall of the first gate; and
   a P-type metal oxide semiconductor (PMOS) transistor, wherein the PMOS transistor includes a second gate and a second spacer structure disposed on a sidewall of the second gate in the first direction, wherein the second spacer structure has a second thickness that is greater than the first thickness, and wherein the second thickness is measured from an outermost point of an outer surface of the second spacer structure to the sidewall of the second gate, wherein the first spacer structure and the second spacer structure have an identical number of sub-layers, and wherein the first spacer structure and the second spacer structure each have at least three sub-layers.

2. The semiconductor device of claim 1, wherein:
   the sub-layers of the first spacer structure include a plurality of first spacers that have different dielectric constants from one another; and
   the sub-layers of the second spacer structure include a plurality of second spacers that have different dielectric constants from one another.

3. The semiconductor device of claim 2, wherein:
   the plurality of first spacers includes a first inner spacer and a first outer spacer, the first inner spacer being disposed closer to the first gate than the first outer spacer;
   the plurality of second spacers includes a second inner spacer and a second outer spacer, the second inner spacer being disposed closer to the second gate than the second outer spacer; and
   the second outer spacer is substantially thicker than the first outer spacer in the first direction.

4. The semiconductor device of claim 3, wherein a ratio between a thickness of the second outer spacer and a thickness of the first outer spacer is in a range from about 3.33:1 to about 6:1.

5. The semiconductor device of claim 3, wherein a thickness of the second inner spacer is substantially equal to a thickness of the first inner spacer.

6. The semiconductor device of claim 3, wherein:
   a first air spacer is disposed between the first inner spacer and the first outer spacer; and
   a second air spacer is disposed between the second inner spacer and the second outer spacer.

7. The semiconductor device of claim 6, where:
   a ratio between a thickness of the second air spacer and the second outer spacer is in a range from about 0.25:1 to about 0.35:1.

8. The semiconductor device of claim 1, wherein:
   the NMOS transistor includes first source/drain regions disposed on opposite sides of the first gate;
   the PMOS transistor includes second source/drain regions disposed on opposite sides of the second gate; and
   a bottom surface of the second spacer structure is in direct contact with a portion of a top surface of the second source/drain regions.

9. The semiconductor device of claim 8, wherein a bottom surface of the first spacer structure is substantially free from being in direct contact with a portion of a top surface of the first source/drain regions.

10. The semiconductor device of claim 8, wherein:
    the first source/drain regions are spaced apart by a first distance;
    the second source/drain regions are spaced apart by a second distance; and
    a ratio of the first distance and the second distance is in a range between about 0.6:1 and about 0.9:1.

11. The semiconductor device of claim 1, wherein:
    the semiconductor device includes a static random access memory (SRAM) that includes a pass-gate (PG) device, a pull-down (PD) device, and a pull-up (PU) device;
    the NMOS transistor is a part of the PG device or a part of the PD device; and
    the PMOS transistor is a part of the PU device.

12. A semiconductor device, comprising:
    a static random access memory (SRAM) that includes at least a pass-gate (PG) transistor and a pull-up (PU) transistor;

wherein:

the PG transistor includes a first gate disposed over a substrate, a first gate spacer structure disposed on sidewalls of the first gate, and first source/drain regions disposed in the substrate;

the PU transistor includes a second gate disposed over the substrate, a second gate spacer structure disposed on sidewalls of the second gate, and second source/drain regions disposed in the substrate;

the first gate spacer structure has a first maximum lateral dimension;

the second gate spacer structure has a second maximum lateral dimension substantially greater than the first maximum lateral dimension; and the first gate spacer structure and the second gate spacer structure each includes dielectric spacers and air spacers disposed between the dielectric spacers.

13. The semiconductor device of claim 12, wherein:

the first source/drain regions are spaced apart from one another at a first distance; and the second source/drain regions are spaced apart from one another at second distance greater than the first distance.

14. The semiconductor device of claim 12, wherein an outermost dielectric spacer of the second gate spacer structure is thicker than an outermost dielectric spacer of the first gate spacer structure.

15. A semiconductor device, comprising:

a first transistor that includes:
- a first gate;
- a first spacer structure disposed on a sidewall of the first gate in a first direction, wherein the first spacer structure includes a plurality of first spacers and has a first thickness in the first direction, wherein the first thickness is measured from an outermost point of an outer surface of the first spacer structure to the sidewall of the first gate; and
- first source/drain regions disposed on opposite sides of the first gate; and a second transistor that includes:
- a second gate;
- a second spacer structure disposed on a sidewall of the second gate in the first direction, wherein the second spacer structure includes a plurality of second spacers and has a second thickness that is greater than the first thickness, wherein the second thickness is measured from an outermost point of an outer surface of the second spacer structure to the sidewall of the second gate; and
- a second source/drain regions disposed on opposite sides of the second gate;

wherein a bottom surface of the second spacer structure is in direct contact with a portion of a top surface of the second source/drain regions, and wherein the plurality of the first spacers and the plurality of the second spacers are equal to one another and are each greater than or equal to three.

16. The semiconductor device of claim 15, wherein:

the first transistor is an N-type metal oxide semiconductor (NMOS) transistor;

the second transistor is a P-type metal oxide semiconductor (PMOS) transistor;

the first spacers have different dielectric constants from one another;

the second spacers have different dielectric constants from one another;

the plurality of first spacers includes a first inner spacer and a first outer spacer, the first inner spacer being disposed closer to the first gate than the first outer spacer;

the plurality of second spacers includes a second inner spacer and a second outer spacer, the second inner spacer being disposed closer to the second gate than the second outer spacer; and the second outer spacer is substantially thicker than the first outer spacer in the first direction.

17. The semiconductor device of claim 16, wherein:

a ratio between a thickness of the second outer spacer and a thickness of the first outer spacer is in a range from about 3.33:1 to about 6:1;

a thickness of the second inner spacer is substantially equal to a thickness of the first inner spacer;

a first air spacer is disposed between the first inner spacer and the first outer spacer;

a second air spacer is disposed between the second inner spacer and the second outer spacer; or a ratio between a thickness of the second air spacer and the second outer spacer is in a range from about 0.25:1 to about 0.35:1.

18. The semiconductor device of claim 15, wherein a bottom surface of the first spacer structure is not in direct contact with a portion of a top surface of the first source/drain regions.

19. The semiconductor device of claim 15, wherein:

the first source/drain regions are spaced apart by a first distance;

the second source/drain regions are spaced apart by a second distance; and a ratio of the first distance and the second distance is in a range between about 0.6:1 and about 0.9:1.

20. The semiconductor device of claim 15, wherein:

the semiconductor device includes a static random access memory (SRAM) that includes a pass-gate (PG) device, a pull-down (PD) device, and a pull-up (PU) device;

the first transistor is a part of the PG device or a part of the PD device; and the second transistor is a part of the PU device.

\* \* \* \* \*